United States Patent
Namai

(10) Patent No.: US 9,874,816 B2
(45) Date of Patent: Jan. 23, 2018

(54) RADIATION-SENSITIVE RESIN COMPOSITION AND RESIST PATTERN-FORMING METHOD

(71) Applicant: JSR CORPORATION, Tokyo (JP)

(72) Inventor: Hayato Namai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 37 days.

(21) Appl. No.: 15/079,753

(22) Filed: Mar. 24, 2016

(65) Prior Publication Data

US 2016/0202608 A1 Jul. 14, 2016
US 2017/0363961 A9 Dec. 21, 2017

Related U.S. Application Data

(63) Continuation of application No. PCT/JP2014/074724, filed on Sep. 18, 2014.

(30) Foreign Application Priority Data

Sep. 26, 2013 (JP) .................... 2013-199465

(51) Int. Cl.
| | |
|---|---|
| G03F 7/004 | (2006.01) |
| G03F 7/32 | (2006.01) |
| G03F 7/038 | (2006.01) |
| G03F 7/039 | (2006.01) |
| G03F 7/20 | (2006.01) |
| C08F 220/30 | (2006.01) |
| C08F 220/20 | (2006.01) |
| C08F 220/26 | (2006.01) |
| C08F 220/18 | (2006.01) |
| H01L 21/027 | (2006.01) |
| G03F 7/11 | (2006.01) |

(52) U.S. Cl.
CPC ............ G03F 7/325 (2013.01); C08F 220/18 (2013.01); C08F 220/20 (2013.01); C08F 220/26 (2013.01); C08F 220/30 (2013.01); G03F 7/0045 (2013.01); G03F 7/0046 (2013.01); G03F 7/038 (2013.01); G03F 7/039 (2013.01); G03F 7/0397 (2013.01); G03F 7/11 (2013.01); G03F 7/2004 (2013.01); G03F 7/2037 (2013.01); G03F 7/2041 (2013.01); G03F 7/2059 (2013.01); G03F 7/322 (2013.01); G03F 7/327 (2013.01); H01L 21/0271 (2013.01)

(58) Field of Classification Search
CPC ...... G03F 7/004; G03F 7/0382; G03F 7/0046; G03F 7/20; G03F 7/322; G03F 7/2004; G03F 7/2037; C08F 220/18; C08F 220/20; C08F 220/26; C08F 220/30; H01L 21/0271
USPC ........... 430/20.1, 322, 325, 329, 913, 270.1; 526/268, 326, 321
See application file for complete search history.

(56) References Cited

U.S. PATENT DOCUMENTS

| | | | | |
|---|---|---|---|---|
| 4,910,122 A | | 3/1990 | Arnold et al. | |
| 8,623,590 B2 * | | 1/2014 | Hatakeyama | H01L 21/266 430/270.1 |
| 8,822,617 B2 * | | 9/2014 | Lee | C08F 220/22 526/245 |
| 8,835,096 B2 * | | 9/2014 | Masunaga | G03F 7/0045 430/270.1 |
| 8,951,710 B2 * | | 2/2015 | Masunaga | G03F 7/0045 430/270.1 |
| 9,023,587 B2 * | | 5/2015 | Hatakeyama | G03F 7/322 430/270.1 |
| 9,040,222 B2 * | | 5/2015 | Suka | G03F 7/039 430/270.1 |
| 9,081,290 B2 * | | 7/2015 | Hatakeyama | G03F 7/004 |
| 9,091,918 B2 * | | 7/2015 | Fukushima | C08F 220/24 |

(Continued)

FOREIGN PATENT DOCUMENTS

| | | |
|---|---|---|
| JP | S59-93448 A | 5/1984 |
| JP | H05-188598 A | 7/1993 |
| JP | H06-12452 B2 | 2/1994 |
| JP | H10-207069 A | 8/1998 |

(Continued)

OTHER PUBLICATIONS

International Search Report dated Dec. 16, 2014, in PCT/JP2014/074724 filed Sep. 18, 2014 (w/ English translation).

(Continued)

*Primary Examiner* — Amanda C Walke
(74) *Attorney, Agent, or Firm* — Oblon, McClelland, Maier & Neustadt, L.L.P.

(57) ABSTRACT

A radiation-sensitive resin composition comprises: a polymer, and a radiation-sensitive acid generator. The polymer comprises a structural unit comprising: an acid-labile group; and an oxoacid group or phenolic hydroxyl group protected by the acid-labile group. The acid-labile group is represented by formula (1). $R^1$ and $R^2$ each independently represent a divalent organic group having 1 to 20 carbon atoms. $R^3$ represents a monovalent group having 1 to 40 atoms and having at least one selected from the group consisting of an oxygen atom, a sulfur atom and a nitrogen atom. * denotes a binding site to the oxy group in the oxoacid group or phenolic hydroxyl group protected.

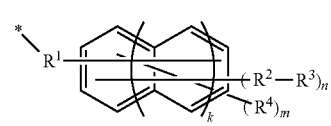

(1)

16 Claims, No Drawings

(56) References Cited

U.S. PATENT DOCUMENTS

| | | | |
|---|---|---|---|
| 9,182,668 B2* | 11/2015 | Hasegawa | G03F 7/038 |
| 9,206,276 B2* | 12/2015 | Ongayi | G03F 7/0045 |
| 9,223,215 B2* | 12/2015 | Yokokawa | G03F 7/0388 |
| 9,261,780 B2* | 2/2016 | Asano | C08F 220/26 |
| 9,291,897 B2* | 3/2016 | Hirano | G03F 7/0388 |
| 9,291,898 B2* | 3/2016 | Yokokawa | G03F 7/0002 |
| 2013/0153535 A1* | 6/2013 | Nakafuji | G03F 7/11 216/41 |
| 2013/0209922 A1* | 8/2013 | Masunaga | G03F 7/0382 430/5 |
| 2014/0014620 A9* | 1/2014 | Nakafuji | G03F 7/11 216/41 |
| 2014/0065545 A1* | 3/2014 | Hatakeyama | G03F 7/0397 430/285.1 |
| 2014/0242521 A1* | 8/2014 | Ongayi | G03F 7/0045 430/296 |
| 2016/0070169 A1* | 3/2016 | Bozano | G03F 7/0045 430/285.1 |

FOREIGN PATENT DOCUMENTS

| | | |
|---|---|---|
| JP | H10-274852 A | 10/1998 |
| JP | 2000-26446 A | 1/2000 |
| JP | 2000-159758 A | 6/2000 |
| JP | 2000-214587 A | 8/2000 |
| JP | 2002-156761 A | 5/2002 |
| JP | 2002-156762 A | 5/2002 |
| JP | 2004-086020 A | 3/2004 |
| JP | 2005-352384 A | 12/2005 |
| JP | 2008-203535 A | 9/2008 |
| JP | 2011-43794 A | 3/2011 |
| JP | 2012-173505 A | 9/2012 |
| WO | WO 2010/095698 A1 | 8/2010 |
| WO | WO 2011/040175 A1 | 4/2011 |

OTHER PUBLICATIONS

Office Action dated Nov. 14, 2017, in Japanese Patent Application No. 2015-539153 (w/ Computer-generated English translation).

* cited by examiner

RADIATION-SENSITIVE RESIN COMPOSITION AND RESIST PATTERN-FORMING METHOD

CROSS-REFERENCE TO RELATED APPLICATIONS

The present application is a continuation application of International Application No. PCT/JP2014/074724, filed Sep. 18, 2014, which claims priority to Japanese Patent Application No. 2013-199465, filed Sep. 26, 2013. The contents of these applications are incorporated herein by reference in their entirety.

BACKGROUND OF THE INVENTION

Field of the Invention

The present invention relates to a radiation-sensitive resin composition and a resist pattern-forming method.

Discussion of the Background

According to chemically amplified radiation-sensitive resin compositions, an acid is generated from an acid generator in light-exposed regions upon irradiation with exposure light such as an ArF excimer laser beam or a KrF excimer laser beam, and a reaction permitted by this acid as a catalyst causes alteration of the rate of dissolution in a developer solution at the light-exposed regions and light-unexposed regions, thereby enabling the resist pattern to be formed on a substrate.

Such radiation-sensitive resin compositions are demanded to exhibit superior lithography performances such as sensitivity and resolution along with increasingly minute processing techniques. To address such demands, a variety of structures of acid-labile groups which may be included in polymers in the radiation-sensitive resin compositions have been investigated, and those having a plurality of specific ring structures have been known (see Japanese Unexamined Patent Application, Publication No. 2011-43794). In addition, introduction of various polar groups into the polymer have been also studied, and those having a lactone ring structure have been known (see Japanese Unexamined Patent Application, Publication Nos. 2000-26446, 2000-159758, H10-207069 and H10-274852). These radiation-sensitive resin compositions can reportedly improve the resolution.

However, at present when microfabrication of the resist pattern has proceeded to a level for a line width of no greater than 40 nm, the radiation-sensitive resin compositions are required to exhibit a further superior resolution described above, and desired to exhibit not only superior rectangularity of cross-sectional shape, as well as superior LWR (Line Width Roughness) performance that is an indicating variance of line widths, and CDU (Critical Dimension Uniformity) performance that is an indicative of variance of the line widths in greater ranges, but also favorable depth of focus (DOF) and exposure latitude, thereby enabling a pattern with high accuracy to be formed in a high process yield.

SUMMARY OF THE INVENTION

According to one aspect of the present invention, a radiation-sensitive resin composition comprises: a polymer and a radiation-sensitive acid generator. The polymer comprises a structural unit comprising: an acid-labile group; and an oxoacid group or phenolic hydroxyl group protected by the acid-labile group. The acid-labile group is represented by formula (1):

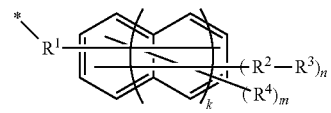

In the formula (1), $R^1$ and $R^2$ each independently represent a divalent organic group having 1 to 20 carbon atoms; $R^3$ represents a monovalent group having 1 to 40 atoms and comprising an oxygen atom, a sulfur atom, a nitrogen atom or a combination thereof; k is an integer of 0 to 4; n is an integer of 1 to 13; $R^4$ represents a halogen atom, a monovalent hydrocarbon group having 1 to 10 carbon atoms or an alkoxy group having 1 to 10 carbon atoms; m is an integer of 0 to 12, wherein a sum of m and n is no greater than 13, in a case where n is no less than 2, a plurality of $R^2$s are identical or different, and a plurality of $R^3$s are identical or different, and in a case where m is no less than 2, a plurality of $R^4$s are identical or different; and * denotes a binding site to the oxy group in the oxoacid group or phenolic hydroxyl group protected.

According to another aspect of the present invention, a resist pattern-forming method comprises applying the radiation-sensitive resin composition directly or indirectly on a substrate to form a resist film. The resist film is exposed. The exposed resist film is developed.

DESCRIPTION OF THE EMBODIMENTS

According to an embodiment of the invention made for solving the aforementioned problems, a radiation-sensitive resin composition contains: a polymer (hereinafter, may be also referred to as "(A) polymer" or "polymer (A)") having a structural unit (hereinafter, may be also referred to as "structural unit (I)") that includes an acid-labile group and an oxoacid group or phenolic hydroxyl group protected by the acid-labile group; and a radiation-sensitive acid generator (hereinafter, may be also referred to as "(B) acid generator" or "acid generator (B)"), wherein the acid-labile group is represented by the following formula (1):

wherein, in the formula (1), $R^1$ and $R^2$ each independently represent a divalent organic group having 1 to 20 carbon atoms; $R^3$ represents a monovalent group having 1 to 40 atoms and having at least one selected from the group consisting of an oxygen atom, a sulfur atom and a nitrogen atom; k is an integer of 0 to 4; n is an integer of 1 to 13; $R^4$ represents a halogen atom, a monovalent hydrocarbon group having 1 to 10 carbon atoms or an alkoxy group having 1 to 10 carbon atoms; m is an integer of 0 to 12, wherein the sum of m and n is no greater than 13, in a case where n is no less than 2, a plurality of $R^2$s may be identical or different, and a plurality of $R^3$s may be identical or different, and in a case where m is no less than 2, a plurality of $R^4$s may be identical or different; and * denotes a binding site to the oxy group in the oxoacid group or phenolic hydroxyl group protected.

According to another embodiment of the invention made for solving the aforementioned problems, a resist pattern-forming method includes the steps of: forming a resist film; exposing the resist film; and developing the resist film exposed, wherein the resist film is formed from the radiation-sensitive resin composition according to the embodiment of the present invention.

The "hydrocarbon group" as referred to herein includes chain hydrocarbon groups, alicyclic hydrocarbon groups and aromatic hydrocarbon groups. This "hydrocarbon group" may be a saturated hydrocarbon group or an unsaturated hydrocarbon group. The "chain hydrocarbon group" as referred to means a hydrocarbon group that is constituted with only a chain structure without having a cyclic structure, and the term "chain hydrocarbon group" includes both linear hydrocarbon groups and branched hydrocarbon groups. The "alicyclic hydrocarbon group" as referred to means a hydrocarbon group that has as a ring structure not an aromatic ring structure but only an alicyclic structure, and the term "alicyclic hydrocarbon group" includes both monocyclic alicyclic hydrocarbon groups and polycyclic alicyclic hydrocarbon groups. However, it is not necessary for the alicyclic hydrocarbon group to be constituted with only an alicyclic structure, and a part thereof may have a chain structure. The "aromatic hydrocarbon group" as referred to means a hydrocarbon group that has an aromatic ring structure as a ring structure. However, it is not necessary for the aromatic hydrocarbon group to be constituted with only an aromatic ring structure, and a part thereof may have a chain structure and/or an alicyclic structure. Moreover, the "organic group" as referred to means a group having at least one carbon atom.

According to the radiation-sensitive resin composition and the resist pattern-forming method of the embodiment of the present invention, a resist pattern can be formed exhibiting low LWR and superior CDU, a high resolution, and superior rectangularity of cross-sectional shape, while a superior depth of focus and exposure latitude are attained. Therefore, these can be suitably used in manufacture of semiconductor devices in which further progress of miniaturization is expected in the future. Hereinafter, the embodiments will be explained in detail.

Radiation-Sensitive Resin Composition

The radiation-sensitive resin composition contains the polymer (A) and the acid generator (B). The radiation-sensitive resin composition may contain (C) an acid diffusion controller and (D) a solvent as favorable components, and may also contain other optional component within a range not leading to impairment of the effects of the present invention. Hereinafter, each component will be described.

Polymer (A)

The polymer (A) has the structural unit (I). Due to the polymer (A) having the structural unit (I), the radiation-sensitive resin composition exhibits superior LWR performance, CDU performance, resolution, rectangularity of cross-sectional shape, depth of focus and exposure latitude (hereinafter, may be also referred to as "LWR performance, etc."). Although not necessarily clarified, the reason for achieving the effects described above due to the radiation-sensitive resin composition having the aforementioned constitution is inferred as in the following, for example. Specifically, the structural unit (I) includes an acid-labile group, and the acid-labile group has an aromatic ring, and a group ($R^3$) that bonds to this aromatic ring via $R^2$ and includes at least one selected from the group consisting of O, S and N. Owing to the presence of this aromatic ring, and the polarity of the $R^3$ group, the diffusion length of the acid, which is generated from the acid generator (B), in the resist film would be appropriately decreased. In addition, the solubility of the polymer (A) in a developer solution would be appropriately adjusted, thereby enabling the dissolution contrast between the light-exposed region and the light-unexposed region to be enhanced. Moreover, it is considered that the effect described above would be more achieved due to the presence of an acid-labile moiety in the vicinity of the aromatic ring and the $R^3$ group. As a result, the LWR performance, etc., of the radiation-sensitive resin composition would be improved.

In addition to the structural unit (I), the polymer (A) may have: a structural unit (II) that is other than the structural unit (I) and includes an acid-labile group; a structural unit (III) that includes at least one selected from the group consisting of a lactone structure, a cyclic carbonate structure and a sultone structure; a structural unit (IV) that includes an alcoholic hydroxyl group; a structural unit (V) that includes a phenolic hydroxyl group; and/or a structural unit (VI) that includes a group (z) having a hydroxy group at the end thereof and at least one fluorine atom or fluorinated alkyl group on a carbon atom adjacent to the hydroxy group and may also have other structural unit than the foregoing structural units (I) to (VI). The polymer (A) may have either one, or two or more types of each structural unit. Hereinafter, each structural unit will be described.

Structural Unit (I)

The structural unit (I) includes an acid-labile group (hereinafter, may be also referred to as "group (I)") and an oxoacid group or phenolic hydroxyl group protected by the acid-labile group (hereinafter, may be also referred to as "oxoacid group, etc."), wherein the acid-labile group is a structural unit represented by the following formula (1). The "oxoacid group" as referred to means a group derived from an acid (oxoacid) in which a hydrogen atom dissociable as a proton bonds to an oxygen atom (oxy group). The "acid-labile group" as referred to means a group that protects the oxoacid group, etc., by substituting the hydrogen atom bonded to the oxy group, and that is dissociated by an action of an acid.

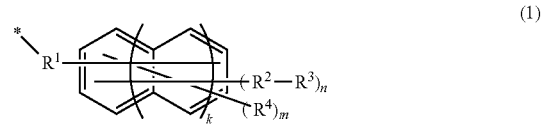

(1)

In the above formula (1), $R^1$ and $R^2$ each independently represent a divalent organic group having 1 to 20 carbon atoms; $R^3$ represents a monovalent group having 1 to 20 carbon atoms and having at least one selected from the group consisting of an oxygen atom, a sulfur atom and a nitrogen atom; k is an integer of 0 to 4; n is an integer of 1 to 13; $R^4$ represents a halogen atom, a monovalent hydrocarbon group having 1 to 10 carbon atoms or an alkoxy group having 1 to 10 carbon atoms; m is an integer of 0 to 12, wherein the sum of m and n is no greater than 13, in a case where n is no less than 2, a plurality of $R^2$s may be identical or different, and a plurality of $R^3$s may be identical or different, and in a case where m is no less than 2, a plurality of $R^4$s may be identical or different; and * denotes a binding site to the oxy group in the oxoacid group or phenolic hydroxyl group protected.

The group (I) is an acid-labile group. The group (I) can be the acid-labile group in cases in which, for example: the carbon atom in $R^1$ bonding to an oxy group of the oxoacid group, etc. is a tertiary carbon atom (bonding to three carbon atoms); the carbon atom in $R^1$ bonding to an oxy group of the oxoacid group, etc., bonds also to other one oxygen atom to form an O—C—O structure; and the like. Of these, in light of more adequate acid-lability attained by the group (I), the case in which the carbon atom in $R^1$ bonding to an oxy group of the oxoacid group, etc. is a tertiary carbon atom is preferred.

Examples of the oxoacid group include a carboxy group, a sulfo group, a sulfuric acid group, a phosphoric acid group, and the like. Of these, in light of more adequate acid-lability attained by the group (I) and in light of ease in the synthesis of a monomer that gives the structural unit (I), the carboxy group is preferred.

The divalent organic group having 1 to 20 carbon atoms represented by $R^1$ is exemplified by: a divalent hydrocarbon group having 1 to 20 carbon atoms; a group (a) obtained from this hydrocarbon group by incorporating a divalent hetero atom-containing group between two adjacent carbon atoms or at the end on the atomic bonding side of the hydrocarbon group; a group obtained by substituting with a monovalent hetero atom-containing group, a part or all of hydrogen atoms included in the hydrocarbon group or the group (a); and the like.

The divalent hydrocarbon group having 1 to 20 carbon atoms is exemplified by a divalent chain hydrocarbon group having 1 to 20 carbon atoms, a divalent alicyclic hydrocarbon group having 3 to 20 carbon atoms, a divalent aromatic hydrocarbon group having 6 to 20 carbon atoms, and the like.

Examples of the divalent chain hydrocarbon group having 1 to 20 carbon atoms include:

alkanediyl groups such as a methanediyl group, an ethanediyl group, a propanediyl group and a butanediyl group;

alkenediyl groups such as an ethenediyl group, a propenediyl group, and a butenediyl group;

alkynediyl groups such as an ethynediyl group, a propynediyl group and a butynediyl group; and the like.

Examples of the divalent alicyclic hydrocarbon group having 3 to 20 carbon atoms include:

cycloalkanediyl groups such as a cyclopropanediyl group, a cyclobutanediyl group, a cyclopentanediyl group, a cyclohexanediyl group, a norbornanediyl group and an adamantanediyl group;

cycloalkenediyl groups such as a cyclopentenediyl group, a cyclohexenediyl group and a norbornenediyl group; and the like.

Examples of the divalent aromatic hydrocarbon group having 6 to 20 carbon atoms include:

arenediyl groups such as a benzenediyl group, a toluenediyl group, a xylenediyl group, a naphthalenediyl group and an anthracenediyl group;

arenediylalkanediyl groups such as a benzenediylmethanediyl group and a naphthalenediylmethanediyl group; and the like.

Examples of the divalent hetero atom-containing group include —O—, —CO—, —S—, —CS—, —NR'—, a combination of at least two of these, and the like, wherein R' represents a hydrogen atom or a monovalent hydrocarbon group. Of these, —COO— is preferred.

Examples of the monovalent hetero atom-containing group include halogen atoms such as a fluorine atom, a chlorine atom, a bromine atom and an iodine atom, a hydroxy group, a carboxy group, a cyano group, an amino group, a sulfanyl group (—SH), and the like. Of these, the fluorine atom is preferred.

$R^1$ is preferably a group represented by any one of the following formulae (a-1) to (a-3) (hereinafter, may be also referred to as "groups (a1) to (a3)").

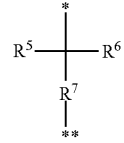

(a-1)

(a-2)

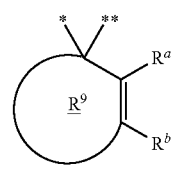

(a-3)

In the above formulae (a-1) to (a-3), * denotes a binding site to the oxy group in the oxoacid group or phenolic hydroxyl group protected; and ** denotes a site bound to the aromatic ring in the above formula (1).

In the above formula (a-1), $R^5$ and $R^6$ each independently represent a monovalent chain hydrocarbon group having 1 to 10 carbon atoms, a monovalent alicyclic hydrocarbon group having 3 to 10 carbon atoms, a group having —COO— between two adjacent carbon atoms in the chain hydrocarbon group and the alicyclic hydrocarbon group, or a group obtained by substituting a part of hydrogen atoms included in any one of these groups with a fluorine atom or a hydroxy group; and $R^7$ represents a single bond or a divalent hydrocarbon group having 1 to 18 carbon atoms.

In the above formula (a-2), $R^8$ represents a substituted or unsubstituted divalent alicyclic hydrocarbon group having 3 to 20 carbon atoms.

In the above formula (a-3), $R^9$ represents a substituted or unsubstituted tetravalent alicyclic hydrocarbon group having 5 to 20 ring atoms and having a double bond; and $R^a$ and $R^b$ each independently represent a hydrogen atom or a monovalent hydrocarbon group having 1 to 10 carbon atoms.

Examples of the monovalent chain hydrocarbon group having 1 to 10 carbon atoms which may be represented by $R^5$ or $R^6$ include:

alkyl groups such as a methyl group, an ethyl group, a propyl group, a butyl group and a pentyl group;

alkenyl groups such as an ethenyl group, a propenyl group, a butenyl group and a pentenyl group;

alkynyl groups such as an ethynyl group, a propynyl group, a butynyl group and a pentynyl group; and the like.

Of these, the alkyl groups are preferred, and the methyl group, the ethyl group and the propyl group are more preferred.

Examples of the monovalent alicyclic hydrocarbon group having 3 to 10 carbon atoms which may be represented by $R^5$ or $R^6$ include:

cycloalkyl groups such as a cyclopropyl group, a cyclobutyl group, a cyclopentyl group, a cyclopropylmethyl group, a methylcyclopropyl group and a norbornyl group;

cycloalkenyl groups such as a cyclopropenyl group, a cyclobutenyl group, a cyclopentenyl group, a cyclopropenylmethyl group, a methylcyclopropenyl group and a norbornenyl group; and the like.

Of these, the cycloalkenyl groups are preferred, and the cyclopropyl group is more preferred.

Examples of the group having —COO— between two adjacent carbon atoms in the chain hydrocarbon group and the alicyclic hydrocarbon group include:

alkoxycarbonylalkyl groups such as a methoxycarbonylmethyl group and an ethoxycarbonylmethyl group;

groups that have a lactone structure such as a butyrolactone-yl group and a valerolactone-yl group; and the like.

Of these, the methoxycarbonylmethyl group and the butyrolactone-yl group are preferred.

Examples of the group obtained by substituting a part of hydrogen atoms included in any one of these groups with a fluorine atom or a hydroxy group include:

groups substituted with a fluorine atom such as a fluoromethyl group, a trifluoromethyl group, a fluorocyclopropyl group, a fluorobutyrolactone-yl group, a methoxycarbonyldifluoromethyl group and an ethoxycarbonyldifluoromethyl group;

groups substituted with a hydroxy group such as a hydroxymethyl group, a hydroxycyclopropyl group, a hydroxybutyrolactone-yl group, a methoxycarbonylhydroxymethyl group and a hydroxyethoxycarbonylmethyl group; and the like.

Of these, the groups substituted with a fluorine atom are preferred, and the methoxycarbonyldifluoromethyl group is more preferred.

The divalent hydrocarbon group having 1 to 18 carbon atoms which may be represented by $R^7$ is exemplified by the divalent hydrocarbon groups having 1 to 18 carbon atoms among the divalent organic groups exemplified in connection with $R^1$, and the like.

Of these, the monovalent chain hydrocarbon groups are preferred, the alkanediyl groups are more preferred, the alkanediyl groups having 1 to 4 carbon atoms are still more preferred, and the methanediyl group is particularly preferred.

$R^7$ represents preferably a single bond, or a methanediyl group.

The divalent alicyclic hydrocarbon group having 3 to 20 carbon atoms represented by $R^8$ is exemplified by the divalent alicyclic hydrocarbon groups exemplified as the divalent organic group represented by R', and the like.

Of these, the cycloalkanediyl groups are preferred, the monocyclic cycloalkanediyl groups are more preferred, the monocyclic cycloalkanediyl groups having 5 to 8 carbon atoms are still more preferred, and the cyclopentanediyl group and the cyclohexanediyl group are particularly preferred.

Examples of the substituent for the divalent alicyclic hydrocarbon group represented by $R^8$ include a halogen atom, a hydroxy group, an oxo group (=O), and the like. Of these, the oxo group is preferred.

Examples of the tetravalent alicyclic hydrocarbon group having 5 to 20 ring atoms and having a double bond represented by $R^9$ include a 2-cyclopentene-1,1,2,3-tetrayl group, a 2-cyclohexene-1,1,2,3-tetrayl group, a 2-cycloheptene-1,1,2,3-tetrayl group, a 2-cyclooctene-1,1,2,3-tetrayl group, a bicyclo[4.4.0]-3-decene-2,2,3,4-tetrayl group, and the like.

Of these, the 2-cyclopentene-1,1,2,3-tetrayl group and the 2-cyclohexene-1,1,2,3-tetrayl group are preferred.

Examples of the monovalent hydrocarbon group having 1 to 10 carbon atoms which may be represented by $R^a$ and $R^b$ include: monovalent chain hydrocarbon groups such as a methyl group, an ethyl group, an ethenyl group and an ethynyl group; monovalent alicyclic hydrocarbon groups such as a cyclopentyl group and a cyclopentenyl group; monovalent aromatic hydrocarbon groups such as a phenyl group and a benzyl group; and the like. Of these, the monovalent chain hydrocarbon groups are preferred, alkyl groups are more preferred, and the methyl group is still more preferred.

$R^a$ and $R^b$ each represent preferably a hydrogen atom or a methyl group, and more preferably a hydrogen atom.

The substituent of the tetravalent alicyclic hydrocarbon group having a double bond represented by $R^9$ is exemplified by similar substituents that the divalent alicyclic hydrocarbon group represented by $R^8$ may have, and the like.

The group (a1) is exemplified by groups represented by the following formulae (a-1-1) to (a-1-6) and the like, the group (a2) is exemplified by groups represented by the following formulae (a-2-1) to (a-2-3) and the like, and the group (a3) is exemplified by groups represented by the following formulae (a-3-1) to (a-3-3) and the like, respectively.

(a-1-1)

(a-1-2)

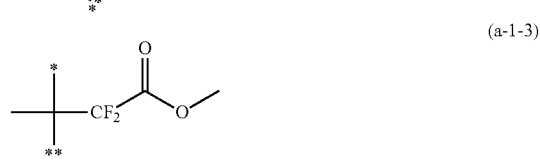

(a-1-3)

(a-1-4)

(a-1-5)

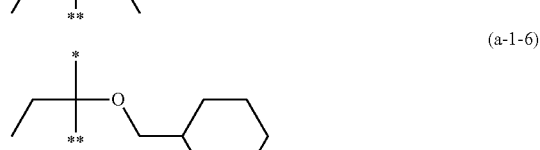

(a-1-6)

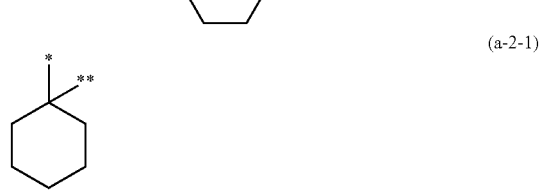

(a-2-1)

-continued

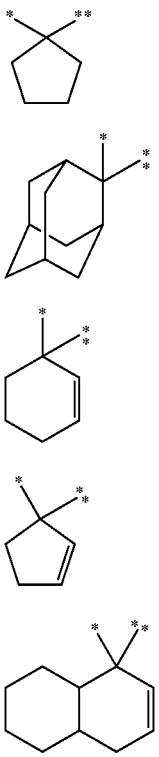

(a-2-2)

(a-2-3)

(a-3-1)

(a-3-2)

(a-3-3)

In the above formulae (a-1-1) to (a-3-3), * and ** are as defined in the above formulae (a-1) to (a-3).

Of these, $R^1$ represents preferably the group represented by any one of the above formulae (a-1-1) to (a-1-4), and the group represented by the above formula (a-2-1) is preferred.

The divalent organic group having 1 to 20 carbon atoms represented by $R^2$ is exemplified by similar groups to those exemplified above as the divalent organic group represented by $R^1$.

Of these, $R^2$ represents preferably the substituted or unsubstituted alkanylidene group, or the substituted or unsubstituted cycloalkanylidene group.

Examples of the alkanylidene group include a methylidene group, an ethylidene group, a propylidene group, a butylidene group, and the like.

Examples of the cycloalkanylidene group include a cyclopropylidene group, a cyclobutylidene group, a cyclopentylidene group, a cyclohexylidene group, norbornylidene group, an adamantylidene group, and the like.

Of these, the methylidene group, the propylidene group, the cyclopentylidene group and the cyclohexylidene group are preferred.

Examples of the substituent of the alkanylidene group and cycloalkanylidene group include a halogen atom, an oxo group, a cyano group, and the like. Of these, the fluorine atom and the oxo group are preferred.

The monovalent group having 1 to 40 atoms and having at least one selected from the group consisting of an oxygen atom, a sulfur atom and a nitrogen atom represented by $R^3$ is exemplified by: (b) a group having hydrogen atoms and at least one selected from the group consisting of O, S and N; (c) a group obtained from a monovalent hydrocarbon group having 1 to 20 carbon atoms by incorporating (α) a divalent group having at least one selected from the group consisting of O, S and N between two adjacent carbon atoms or at the end on the atomic bonding side; (d) a group obtained by substituting a part or all of hydrogen atoms included in the hydrocarbon group and group (c) with (β) a monovalent group having at least one selected from the group consisting of O, S and N; and the like.

Examples of the group (b) include a hydroxy group, a sulfanyl group (—SH), an amino group, and the like. Of these, the hydroxy group is preferred.

The monovalent hydrocarbon group having 1 to 20 carbon atoms is exemplified by a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, and the like.

Examples of the monovalent chain hydrocarbon group having 1 to 20 carbon atoms include:

alkyl groups such as a methyl group, an ethyl group, a propyl group and a butyl group;

alkenyl groups such as an ethenyl group, a propenyl group and a butenyl group;

alkynyl groups such as an ethynyl group, a propynyl group and a butynyl group; and the like.

Examples of the monovalent alicyclic hydrocarbon group having 3 to 20 carbon atoms include:

cycloalkyl groups such as a cyclopropyl group, a cyclobutyl group, a cyclopentyl group, a cyclohexyl group, a cyclooctyl group, a norbornyl group and an adamantyl group;

cycloalkenyl groups such as a cyclopentenyl group, a cyclohexenyl group and a norbornenyl group; and the like.

Examples of the monovalent aromatic hydrocarbon group having 6 to 20 carbon atoms include:

aryl groups such as a phenyl group, a tolyl group, a xylyl group, a naphthyl group and an anthryl group;

aralkyl groups such as a benzyl group, a phenethyl group and a naphthylmethyl group; and the like.

Examples of the group (α) include —O—, —S—, —NR'—, —CO—, —CS—, a combination of at least two of these, and the like, wherein R' represents a hydrogen atom or a monovalent hydrocarbon group having 1 to 10 carbon atoms.

Of these, —CO—, —COO—, —CONR'— and —OCO-COO— are preferred.

Examples of the group (β) include a hydroxy group, a sulfanyl group (—SH), an amino group, a carboxy group, a cyano group, an oxo group (═O), and the like.

Of these, the hydroxy group and the oxo group are preferred, the oxo group is more preferred.

The hetero atom included in $R^3$ is preferably an oxygen atom and a nitrogen atom, and the oxygen atom is more preferred.

The number of atoms of the monovalent group represented by $R^3$ is preferably 1 to 20, more preferably 1 to 10, still more preferably 1 to 5, and particularly preferably 2 to 5.

In light of a further improvement of the LWR performance, etc., $R^3$ represents preferably —OH, —COR, —COOR, —OCOCOOR or —CONR$_2$, wherein R represents a hydrogen atom or a monovalent hydrocarbon group having 1 to 10 carbon atoms. R represents preferably a monovalent chain hydrocarbon group, more preferably an alkyl group, and still more preferably a methyl group.

Examples of the halogen atom which may be represented by $R^4$ include a fluorine atom, a chlorine atom, a bromine atom, an iodine atom, and the like.

The monovalent hydrocarbon group having 1 to 10 carbon atoms which may be represented by $R^4$ is exemplified by the monovalent hydrocarbon groups having 1 to 10 carbon atoms among the monovalent hydrocarbon groups exemplified in connection with $R^3$, and the like.

Examples of the alkoxy group having 1 to 10 carbon atoms which may be represented by $R^4$ include a methoxy group, an ethoxy group, a propoxy group, a butoxy group, and the like.

$R^4$ represents preferably the halogen atom or the hydrocarbon group, and more preferably the hydrocarbon group.

In the above formula (1), m is preferably an integer of 0 to 2, more preferably 0 or 1, and still more preferably 0.

In the above formula (1), k is preferably 0 or 1, and more preferably 0; and n is preferably an integer of 1 to 3, more preferably 1 or 2, and still more preferably 1.

Examples of the group (I) include groups represented by the following formulae (a1) to (a20) (hereinafter, may be also referred to as "groups (I-1) to (I-20)"), and the like.

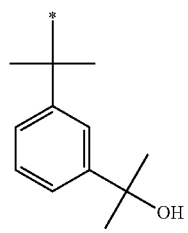
(a1)

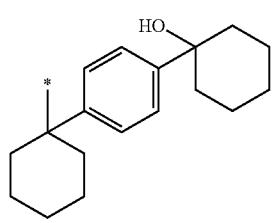
(a2)

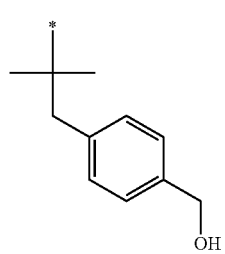
(a3)

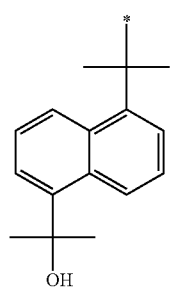
(a4)

-continued

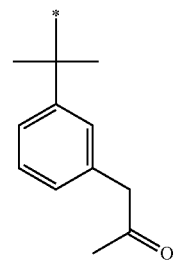
(a5)

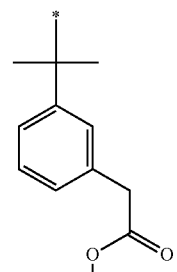
(a6)

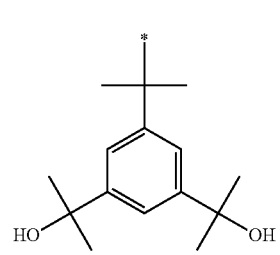
(a7)

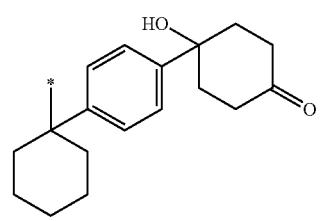
(a8)

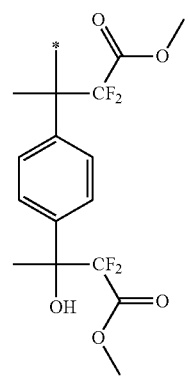
(a9)

(a10)
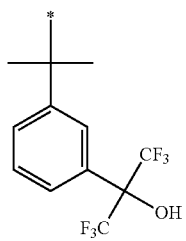
(a11)
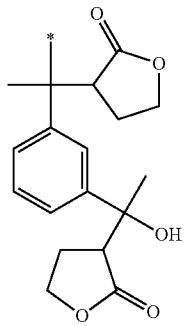
(a12)
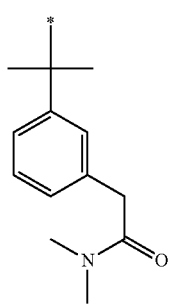
(a13)
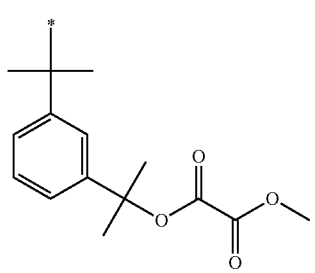
(a14)
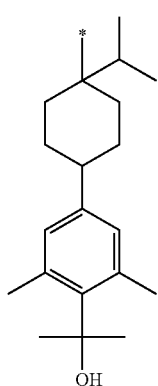
(a15)
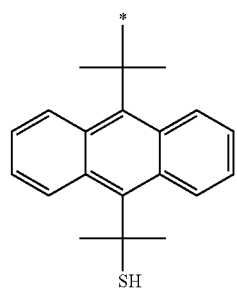
(a16)
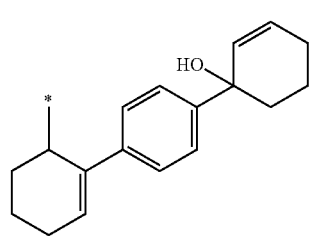
(a17)
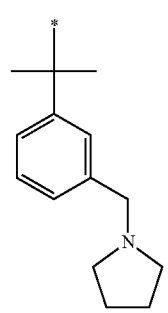
(a18)
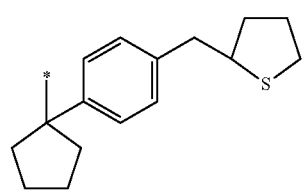
(a19)
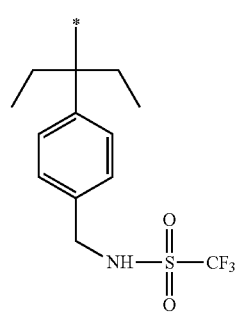

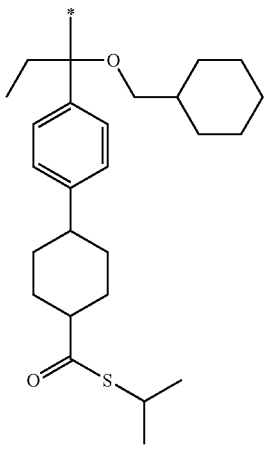
(a20)

In the above formulae (a1) to (a20), * is as defined in the above formula (1).

Of these, the groups (I-1) to (I-13) are preferred, the groups (I-1), (I-2), (I-4) to (I-8), (I-12) and (I-13) are more preferred, and the groups (I-4) to (I-8), (I-12) and (I-13) are still more preferred.

Examples of the structural unit (I) include structural units represented by the following formulae (1-1) to (1-3), and the like.

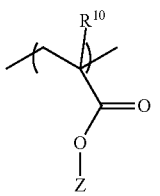
(1-1)

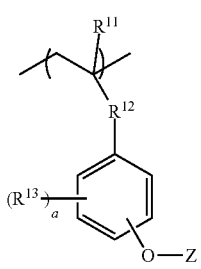
(1-2)

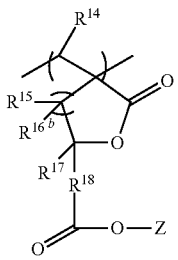
(1-3)

In the above formulae (1-1) to (1-3), Z is the group represented by the above formula (1).

In the above formula (1-1), 1e represents a hydrogen atom, a fluorine atom, a methyl group or a trifluoromethyl group.

In the above formula (1-2), $R^{11}$ represents a hydrogen atom or a methyl group; $R^{12}$ represents a single bond, —O—, —COO— or —CONH—; $R^{13}$ represents a monovalent organic group having 1 to 10 carbon atoms; and a is an integer of 0 to 4, wherein in a case where a is no less than 2, a plurality of $R^{13}$s may be identical or different.

In the above formula (1-3), $R^{14}$ represents a hydrogen atom or a methyl group; $R^{15}$, $R^{16}$ and $R^{17}$ each independently represent a hydrogen atom, a halogen atom, a hydroxy group or a monovalent organic group having 1 to 20 carbon atoms, wherein at least two of one or more $R^{15}$(s), one or more $R^{16}$(s) and $R^{17}$ may taken together represent a ring structure having 3 to 20 ring atoms together with the carbon atom to which the at least two bond; b is an integer of 1 to 4, wherein in a case where b is no less than 2, a plurality of $R^{15}$s may be identical or different, and a plurality of $R^{16}$s may be identical or different; and $R^{18}$ represents a single bond or a divalent organic group having 1 to 20 carbon atoms and $R^{17}$ and $R^{18}$ may taken together represent a ring structure having 3 to 20 ring atoms together with the carbon atom to which these bond.

In light of the degree of copolymerization of the monomer that gives the structural unit (I), $R^{10}$ represents preferably a hydrogen atom or a methyl group, and more preferably a methyl group.

In light of the degree of copolymerization of the monomer that gives the structural unit (I), $R^{11}$ represents preferably a hydrogen atom or a methyl group, and more preferably a hydrogen atom.

In light of the degree of copolymerization of the monomer that gives the structural unit (I), $R^{14}$ represents preferably a hydrogen atom or a methyl group, and more preferably a methyl group.

$R^{12}$ represents preferably a single bond, —COO— or —COHN—, and more preferably a single bond.

$R^{13}$ represents preferably an alkyl group having 1 to 10 carbon atoms or an alkoxy group having 1 to 10 carbon atoms, and more preferably a methyl group, an ethyl group, a methoxy group or an ethoxy group.

In the above formula (1-2), a is preferably an integer of 0 to 2, more preferably 0 or 1, and still more preferably 0.

$R^{15}$, $R^{16}$ and $R^{17}$ each represent preferably a hydrogen atom, a halogen atom or a chain hydrocarbon group having 1 to 10 carbon atoms, more preferably a hydrogen atom, a fluorine atom or an alkyl group, still more preferably a hydrogen atom, a fluorine atom or a methyl group, and particularly preferably a hydrogen atom.

In the above formula (1-3), b is preferably an integer of 1 to 3, more preferably 1 or 2, and still more preferably 1.

$R^{18}$ represents preferably a single bond or a divalent hydrocarbon group having 1 to 20 carbon atoms, more preferably a single bond or an alkanediyl group having 1 to 10 carbon atoms, still more preferably a single bond, a methanediyl group or an ethanediyl group, and particularly preferably a single bond.

Examples of the ring structure having 3 to 20 ring atoms taken together represented by at least two of one or more $R^{15}$(s) and one or more $R^{16}$(s) and $R^{17}$, or by $R^{17}$ and $R^{18}$ include: alicyclic structures such as a cyclopropane structure, a cyclobutane structure, a cyclopentane structure, a cyclohexane structure, a norbornane structure and an adamantane structure; aliphatic heterocyclic structures such as an oxacyclopentane structure, an oxacyclohexane structure, an azacyclopentane structure and a thiacyclopentane structure; and the like.

The structural unit (I-1) is exemplified by structural units represented by the following formulae (1-1-1) and (1-1-2) and the like, the structural unit (I-2) is exemplified by the structural units represented by the following formulae (1-2-

1) to (1-2-3) and the like, and the structural unit (I-3) is exemplified by the structural units represented by the following formulae (1-3-1) to (1-3-3) and the like.

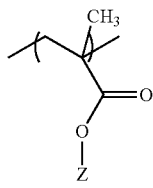

(1-1-1)

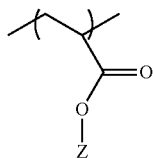

(1-1-2)

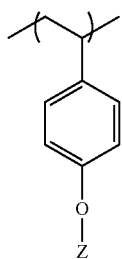

(1-2-1)

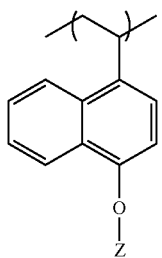

(1-2-2)

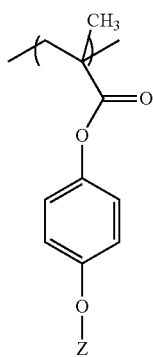

(1-2-3)

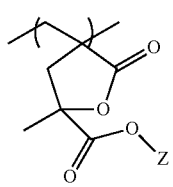

(1-3-1)

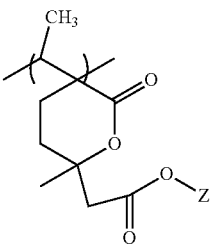

(1-3-2)

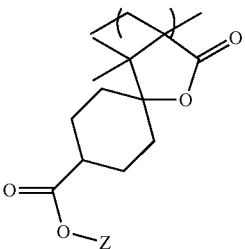

(1-3-3)

In the above formulae (1-1-1) to (1-3-3), Z is as defined in the above formulae (1-1) to (1-3).

Of these, the structural unit (I) is preferably the structural unit (I-1), and more preferably the structural unit represented by the above formula (1-1-1).

The lower limit of the proportion of the structural unit (I) contained with respect to the total structural units constituting the polymer (A) is preferably 1 mol %, more preferably 5 mol %, still more preferably 8 mol %, and particularly preferably 14 mol %. The upper limit of the proportion of the structural unit (I) contained is preferably 70 mol %, more preferably 50 mol %, still more preferably 35 mol %, and particularly preferably 25 mol %. When the proportion of the structural unit (I) falls within the above range, the LWR performance, etc., of the radiation-sensitive resin composition can be improved. When proportion is less than the lower limit, pattern formability of the radiation-sensitive resin composition may be deteriorated. When the proportion is greater than the upper limit, the adhesiveness of the resist film formed from the radiation-sensitive resin composition to the substrate may be deteriorated.

The monomer that gives the structural unit (I) is exemplified by a compound represented by the following formula (i), and the like.

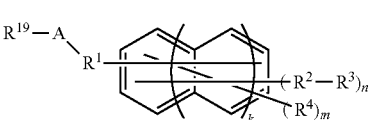

(i)

In the above formula (i), $R^1$ and $R^2$ each independently represent a divalent organic group having 1 to 20 carbon atoms; $R^3$ represents a monovalent group having 1 to 40 atoms and having at least one selected from the group consisting of an oxygen atom, a sulfur atom and a nitrogen atom; k is an integer of 0 to 4; n is an integer of 1 to 13; $R^4$ represents a halogen atom, a monovalent hydrocarbon group having 1 to 10 carbon atoms or an alkoxy group having 1 to 10 carbon atoms; m is an integer of 0 to 12, wherein the sum of m and n is no greater than 13, in a case where n is no less than 2, a plurality of $R^2$s may be identical or different, and a plurality of $R^3$s may be identical or different, and in a case where m is no less than 2, a plurality of $R^4$s may be identical or different; A represents —COO—, —SO$_2$O— or —Ar—O—, wherein Ar represents a substituted or unsubstituted arenediyl group; and $R^{19}$ represents a monovalent group having a polymerizable carbon-carbon double bond.

Examples of the arenediyl group represented by Ar include a benzenediyl group, a naphthalenediyl group, an anthracenediyl group, and the like. Of these, the benzenediyl group is preferred.

Examples of the substituent of the arenediyl group include a halogen atom, a hydroxy group, a cyano group, a nitro group, an alkoxy group, and the like.

Examples of the monovalent group having a polymerizable carbon-carbon double bond represented by $R^{19}$ include a vinyl group, a propenyl group, a butenyl group, and the like.

The compound (i) is exemplified by compounds represented by the following formulae (i-1) to (i-22) (hereinafter, may be also referred to as "compounds (i-1) to (i-22)"), and the like.

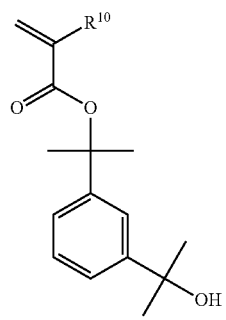
(i-1)

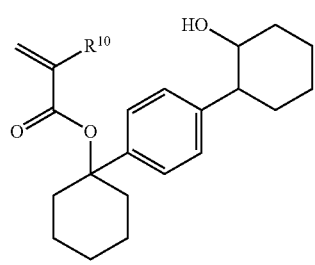
(i-2)

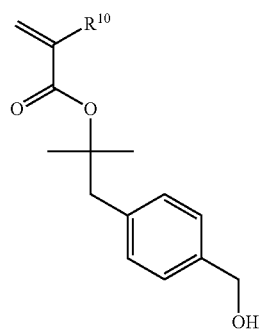
(i-3)

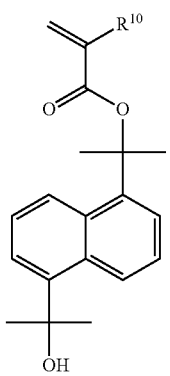
(i-4)

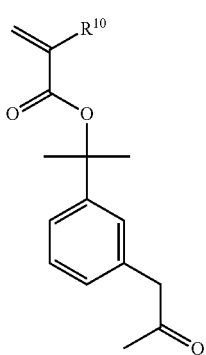
(i-5)

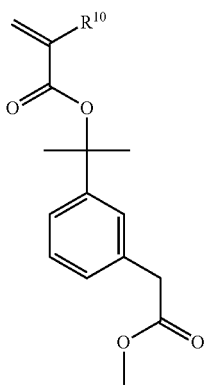
(i-6)

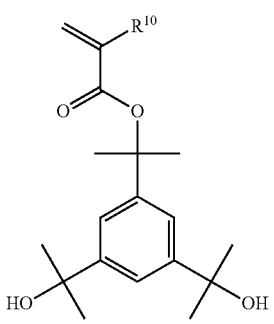
(i-7)

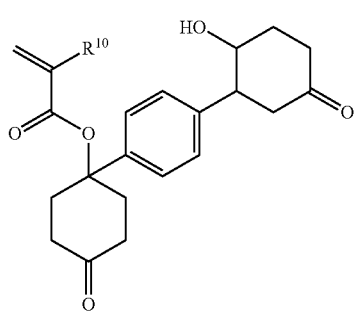
(i-8)
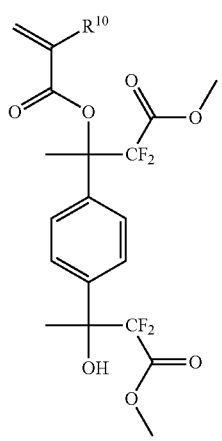
(i-9)
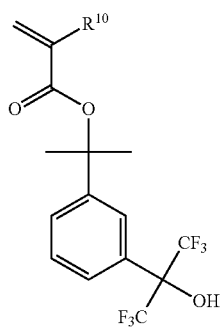
(i-10)
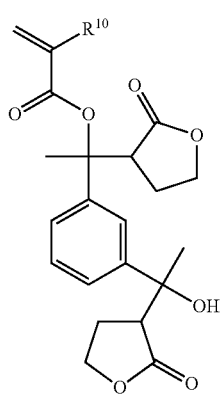
(i-11)
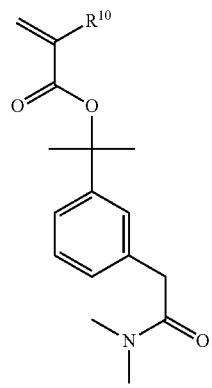
(i-12)
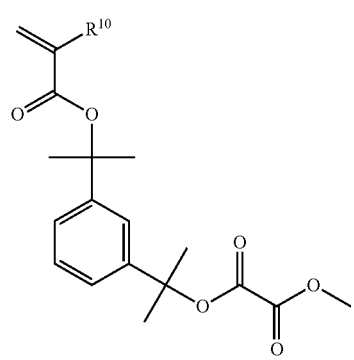
(i-13)
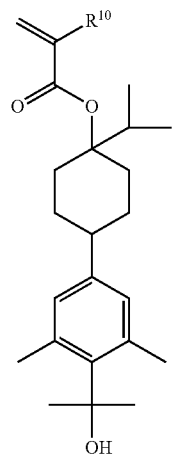
(i-14)
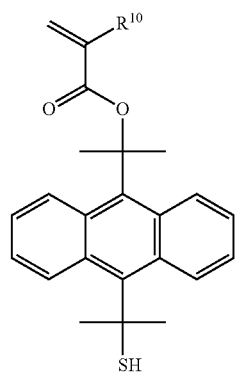
(i-15)

(i-16) 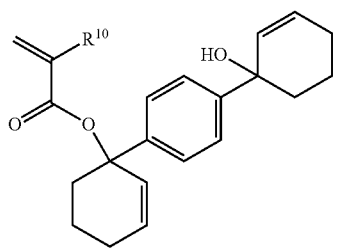
(i-17) 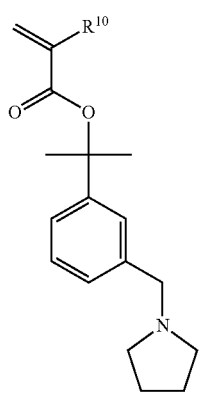
(i-18) 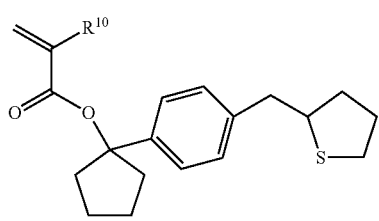
(i-19) 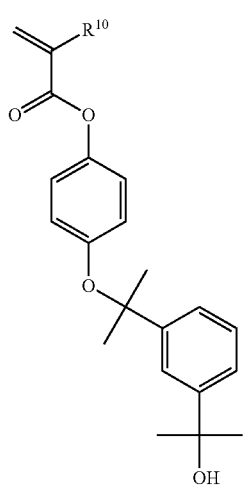
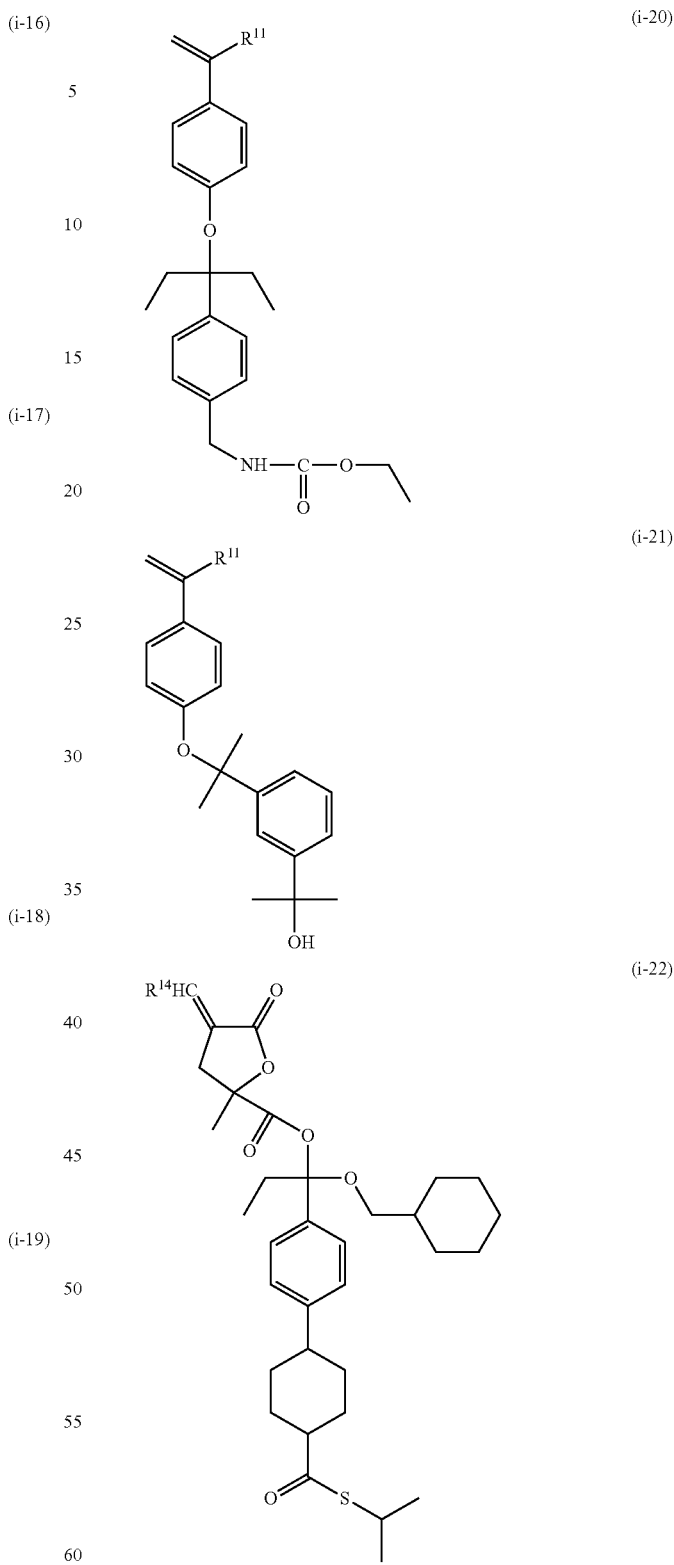
In the above formulae (i-1) to (i-22), $R^{10}$ represents a hydrogen atom, a fluorine atom, a methyl group or a trifluoromethyl group; $R^{11}$ represents a hydrogen atom or a methyl group; and $R^{14}$ represents a hydrogen atom or a methyl group.

Of these, the compounds (i-1) to (i-13), (i-19) and (i-21) are preferred, the compounds (i-1), (i-2), (i-4) to (i-8), (i-12), (i-13), (i-19) and (i-21) are more preferred, and the compounds (i-4) to (i-8), (i-12), (i-13), (i-19) and (i-21) are still more preferred.

In the above formula (i), $R^1$ and $R^2$ preferably represent an identical group. When $R^1$ and $R^2$ represent an identical group, more easy synthesis of a precursor compound of the compound (i) from a corresponding aromatic compound is enabled.

Also, in the above formula (i), $R^1$ and $R^2$ may represent the group that differs from each other.

In a case where the compound (i) is, for example, a compound (i') represented by the above formula (i) wherein A represents —COO—, the compound (i) may be synthesized according to the following scheme.

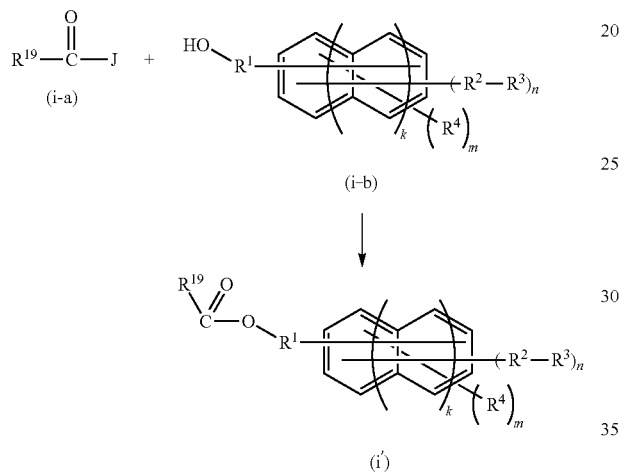

In the above scheme, $R^1$ and $R^2$ each independently represent a divalent organic group having 1 to 20 carbon atoms; $R^3$ represents a monovalent group having 1 to 40 atoms and having at least one selected from the group consisting of an oxygen atom, a sulfur atom and a nitrogen atom; k is an integer of 0 to 4; n is an integer of 1 to 13; $R^4$ represents a halogen atom, a monovalent hydrocarbon group having 1 to 10 carbon atoms or an alkoxy group having 1 to 10 carbon atoms; m is an integer of 0 to 12, wherein the sum of m and n is no greater than 13, in a case where n is no less than 2, a plurality of $R^2$s may be identical or different, and a plurality of $R^3$s may be identical or different, and in a case where m is no less than 2, a plurality of $R^4$s may be identical or different; J represents a halogen atom, a hydroxy group or —OCOR', wherein R' represents a monovalent hydrocarbon group; and $R^{19}$ represents a monovalent group having a polymerizable carbon-carbon double bond.

Examples of the halogen atom which may be represented by J include a fluorine atom, a chlorine atom, a bromine atom, an iodine atom, and the like. Of these, the chlorine atom and the bromine atom are preferred, and the chlorine atom is more preferred.

The compound (i') may be obtained by reacting a polymerizable carbon-carbon double bond-containing compound represented by the above formula (i-a) with a hydroxy compound represented by the above formula (i-b) in the presence of a base such as triethylamine or 1,4-diazabicyclo[2.2.2]octane in a solvent such as acetonitrile. By appropri- ately purifying the resulting product by column chromatography, recrystallization, distillation, etc., the compound (i') can be isolated.

The compound (i) other than the compound (i') may be also synthesized in a similar manner to that of the compound (i').

Structural Unit (II)

The structural unit (II) is other than the structural unit (I), and includes an acid-labile group. Due to having the structural unit (II), in addition to the structural unit (I), as a structural unit that includes the acid-labile group, the polymer (A) can more adequately adjust the solubility in a developer solution, and consequently, the LWR performance, etc., of the radiation-sensitive resin composition can be improved. The structural unit (II) is exemplified by a structural unit represented by the following formula (2-1) or (2-2) (hereinafter, may be also referred to as "structural unit (II-1) or (II-2)"), and the like. A group represented by —$CR^{21}R^{22}R^{23}$ in the following formula (2-1) and a group represented by —$CR^{25}R^{26}R^{27}$ in the following formula (2-2) are the acid-labile group.

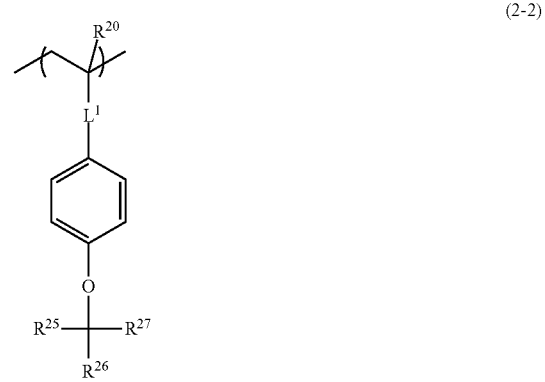

In the above formula (2-1), $R^{20}$ represents a hydrogen atom, a fluorine atom, a methyl group or a trifluoromethyl group; $R^{21}$ represents a monovalent chain hydrocarbon group having 1 to 10 carbon atoms or a monovalent alicyclic hydrocarbon group having 3 to 20 carbon atoms; and $R^{22}$ and $R^{23}$ each independently represent a monovalent chain hydrocarbon group having 1 to 10 carbon atoms or a monovalent alicyclic hydrocarbon group having 3 to 20 carbon atoms, or $R^{22}$ and $R^{23}$ taken together represent an alicyclic structure having 3 to 20 carbon atoms together with the carbon atom to which $R^{22}$ and $R^{23}$ bond.

In the above formula (2-2), $R^{24}$ represents a hydrogen atom or a methyl group; $L^1$ represents a single bond, —COO— or —COHN—; $R^{25}$ represents a hydrogen atom or a monovalent hydrocarbon group having 1 to 20 carbon atoms; and $R^{26}$ and $R^{27}$ each independently represent a monovalent hydrocarbon group having 1 to 20 carbon atoms or a monovalent oxyhydrocarbon group having 1 to 20 carbon atoms.

As the structural unit (II-1), the structural units represented by the following formulae (2-1-1) to (2-1-4) (hereinafter, may be also referred to as "structural units (II-1-1) to (II-1-4)") are preferred. As the structural unit (II-2), the structural unit represented by the following formula (2-2-1) (hereinafter, may be also referred to as "structural unit (II-2-1)") is preferred.

(2-1-1)

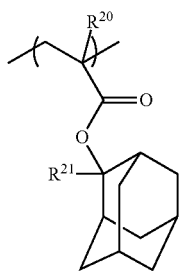

(2-1-2)

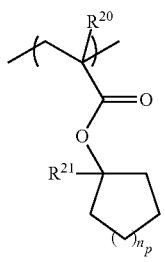

(2-1-3)

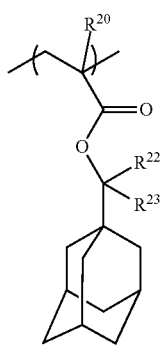

(2-1-4)

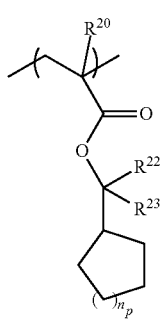

(2-2-1)

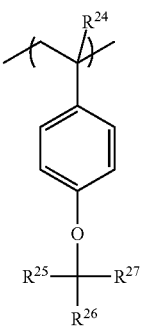

In the above formulae (2-1-1) to (2-1-4), $R^{20}$ to $R^{23}$ are as defined in the above formula (2-1); and $n_p$ is each independently an integer of 1 to 4.

In the above formula (2-2-1), $R^{24}$ to $R^{27}$ are as defined in the above formula (2-2).

The structural unit (II-1) is exemplified by structural units represented by the following formulae, and the like.

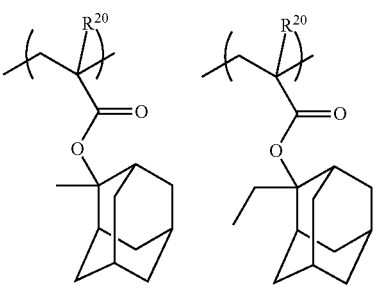

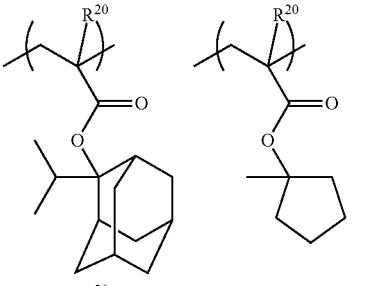

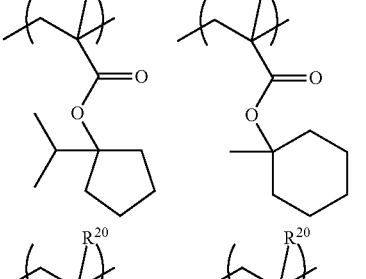

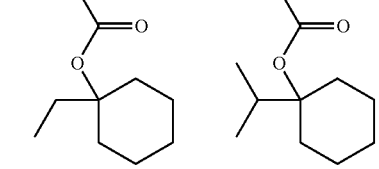

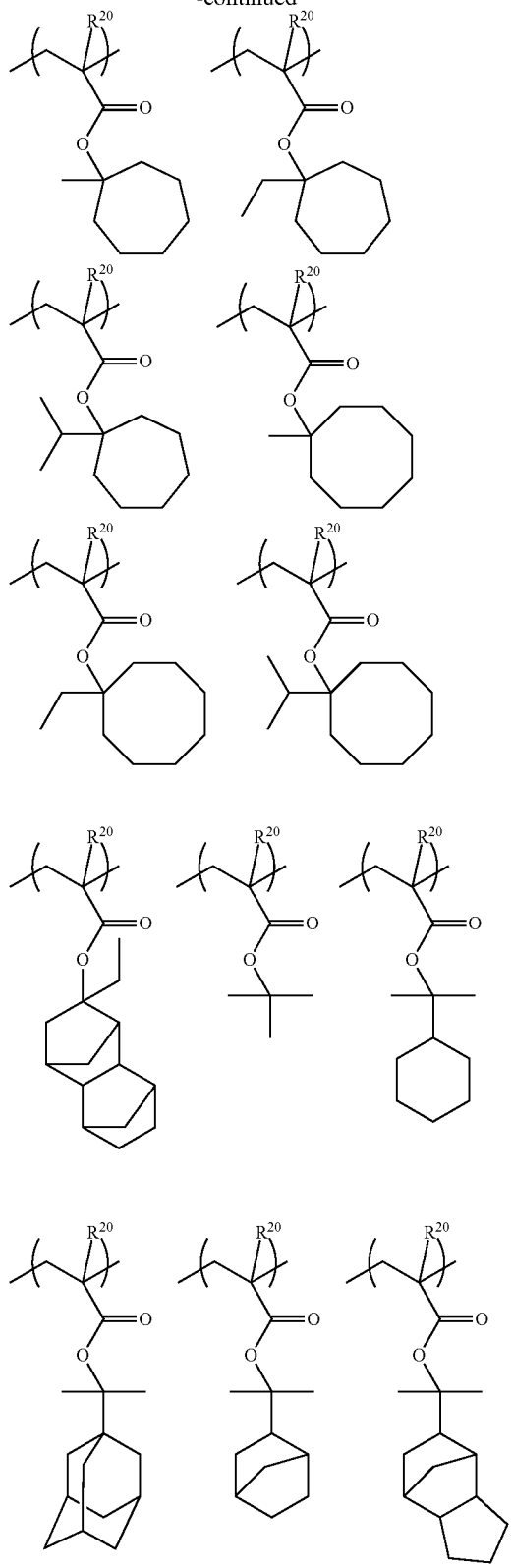
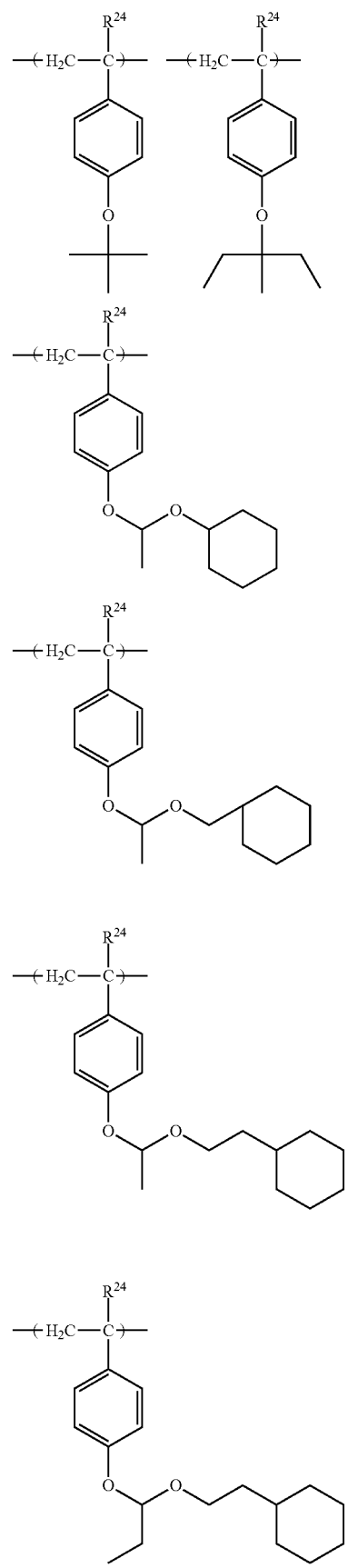
In the above formulae, $R^{20}$ is as defined in the above formula (2-1).
The structural unit (II-2) is exemplified by structural units represented by the following formulae, and the like.

-continued

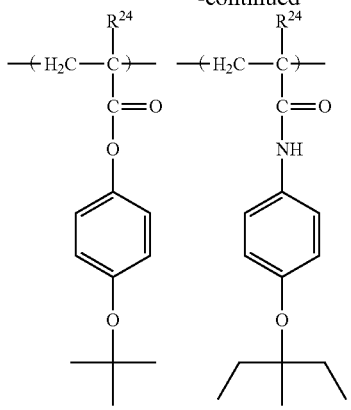

In the above formula, $R^{24}$ is as defined in the above formula (2-2).

The structural unit (II-1) is preferably a structural unit derived from 2-alkyladamantan-2-yl (meth)acrylate, a structural unit derived from 1-alkylcyclopentan-1-yl (meth)acrylate, a structural unit derived from 2-adamantyl-2-propyl (meth)acrylate, a structural unit derived from 2-cyclohexyl-2-propyl (meth)acrylate or a structural unit derived from 2-alkyltetracyclododecan-2-yl (meth)acrylate.

The structural unit (II-2) is preferably a structural unit derived from 1-oxyhydrocarbon-substituted-1-alkyloxystyrene, more preferably a structural unit derived from 1-cycloalkyl-1-alkyloxystyrene, and still more preferably a structural unit derived from 1-cyclohexylethyloxy-1-ethyloxystyrene.

The lower limit of the proportion of the structural unit (II) contained with respect to the total structural units constituting the polymer (A) is preferably 5 mol %, more preferably 10 mol %, and still more preferably 15 mol %. The upper limit of the proportion is preferably 80 mol %, more preferably 60 mol %, and still more preferably 45 mol %. When the proportion falls within the above range, the LWR performance, etc., of the radiation-sensitive resin composition can be more improved.

The lower limit of the proportion of the structural unit that includes the acid-labile group contained in the polymer (A), i.e., the proportion of the total of the structural unit (I) and the structural unit (II) contained with respect to the total structural units constituting the polymer (A) is preferably 5 mol %, more preferably 20 mol %, and still more preferably 30 mol %. The upper limit of the proportion is preferably 80 mol %, more preferably 70 mol %, and still more preferably 65 mol %. When the proportion of the total of the structural units (I) and (II) falls within the above range, the LWR performance, etc., of the radiation-sensitive resin composition can be further improved.

Structural Unit (III)

The structural unit (III) has at least one selected from the group consisting of a lactone structure, a cyclic carbonate structure and a sultone structure (except for the structural unit (I)). When the polymer (A) further has the structural unit (III), the solubility of the polymer (A) in a developer solution can be appropriately adjusted, and consequently the LWR performance, etc., of the radiation-sensitive resin composition can be more improved. Moreover, the adhesiveness between a substrate and the resist pattern formed from the radiation-sensitive resin composition can be improved.

The structural unit (III) is exemplified by structural units represented by the following formulae, and the like.

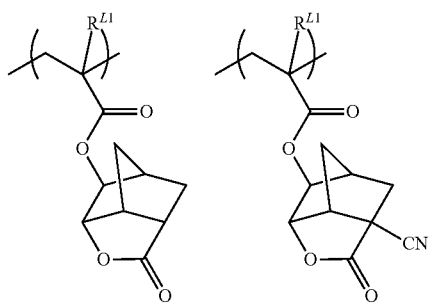

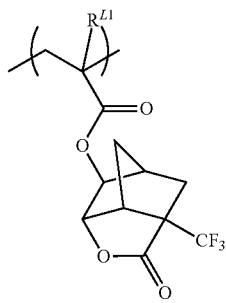

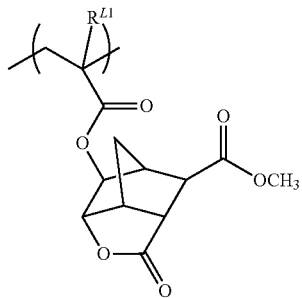

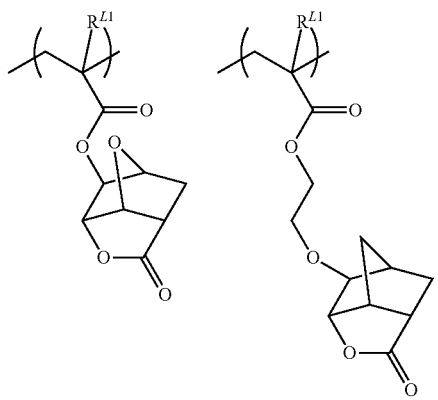

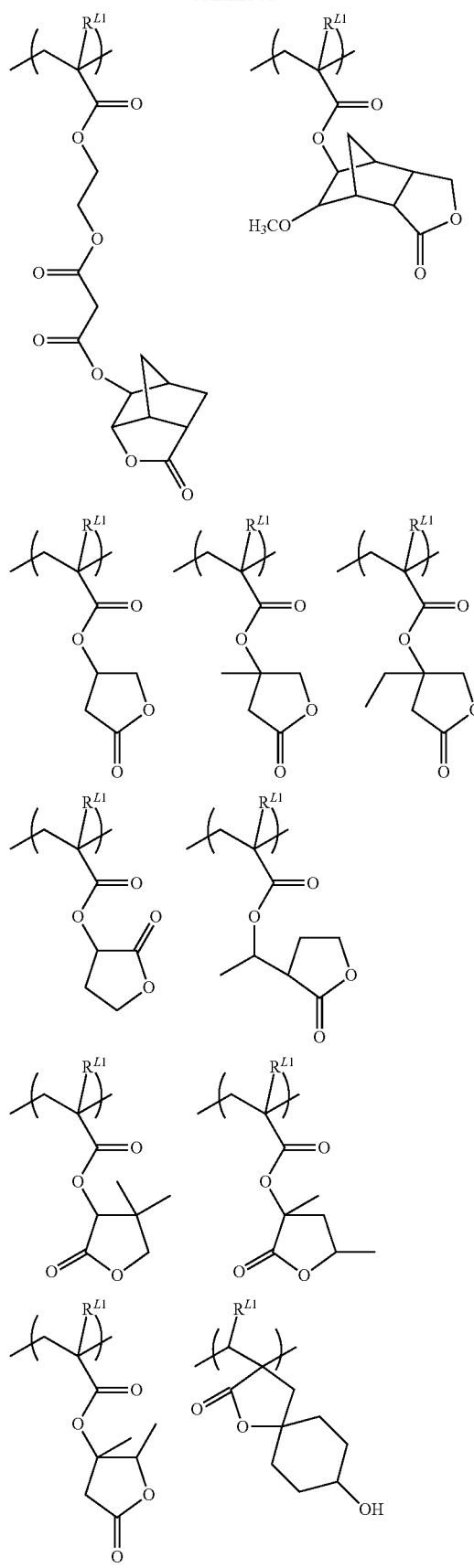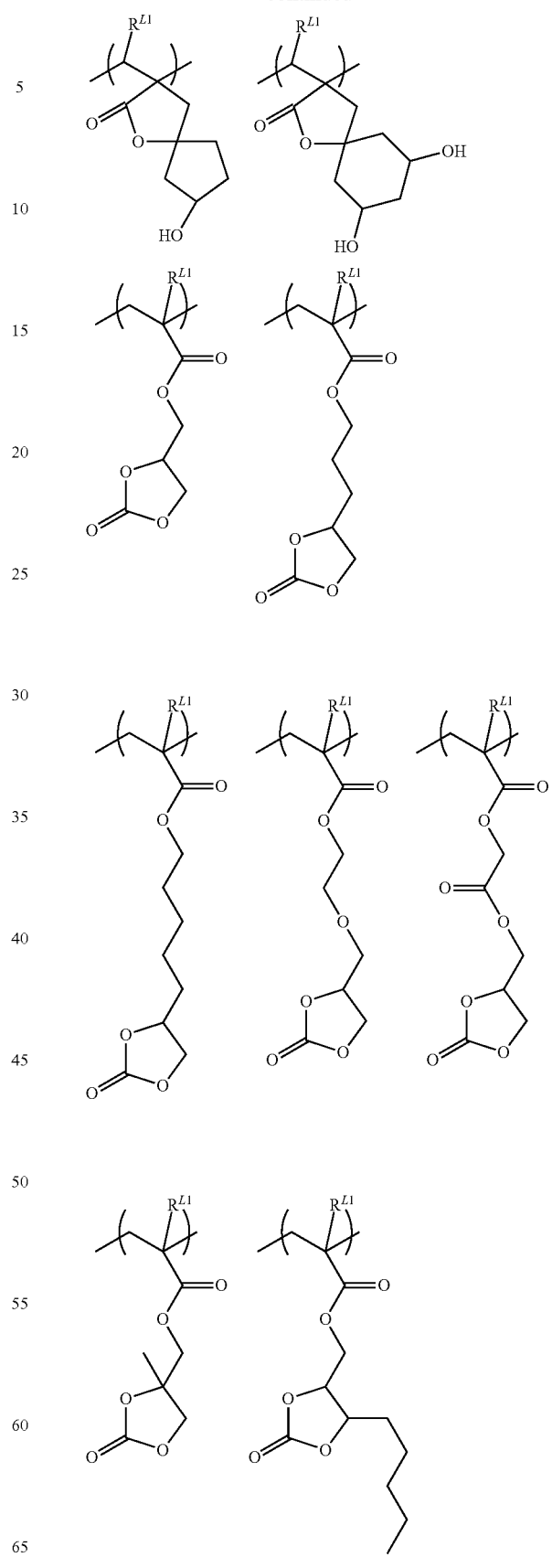

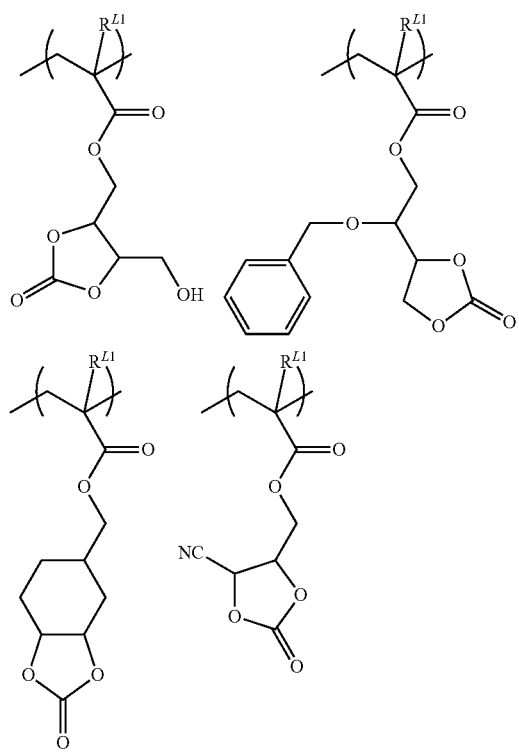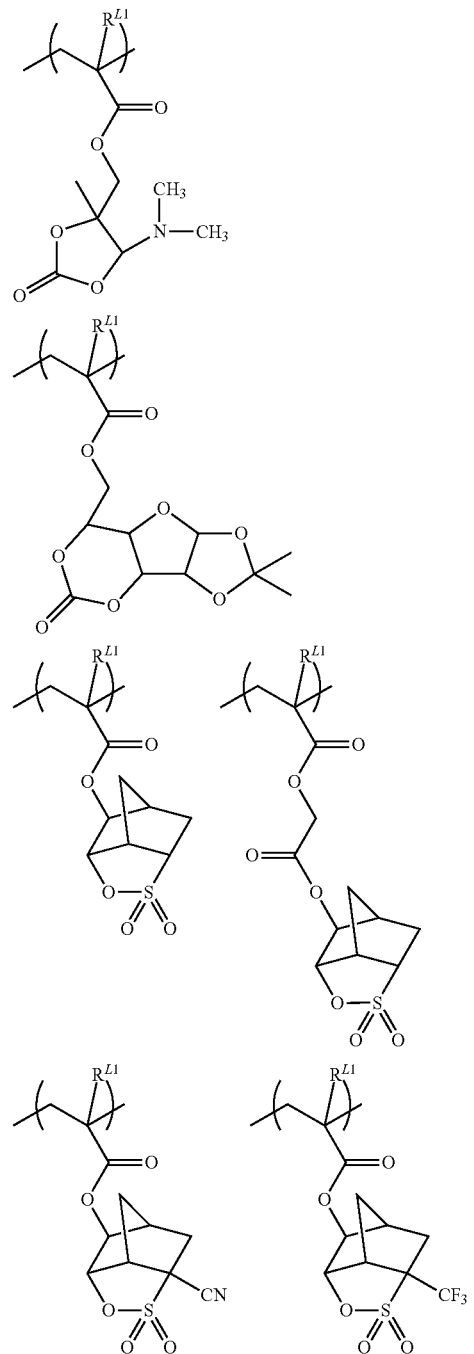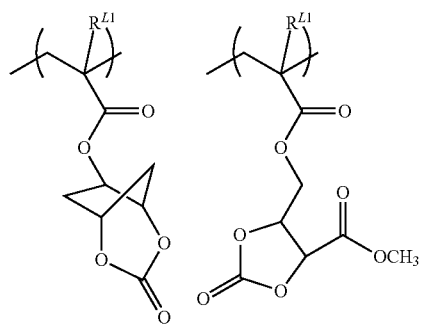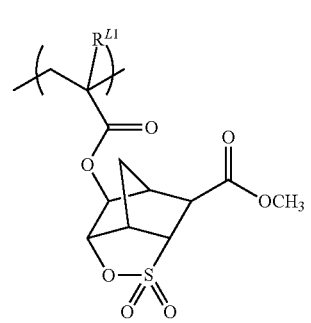

-continued

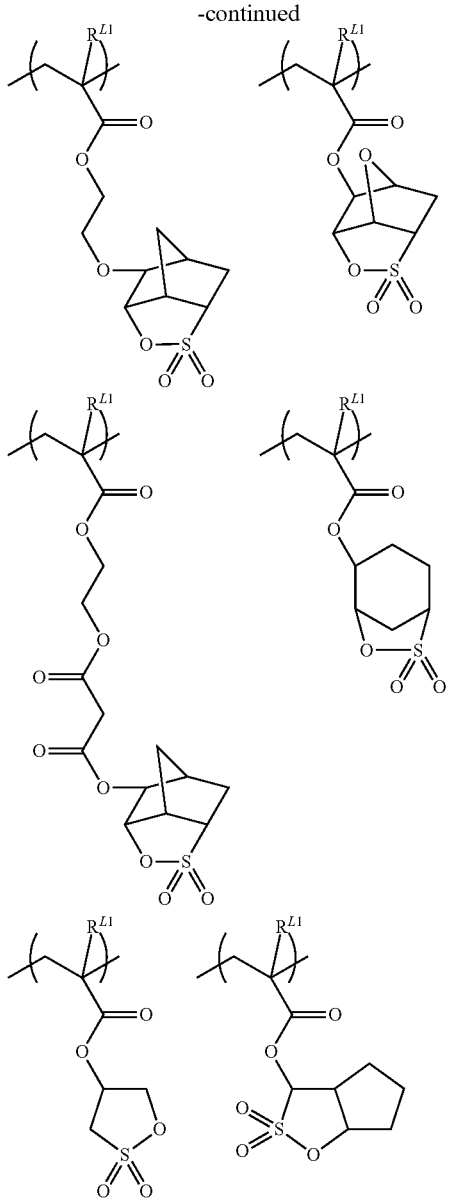

In the above formulae, $R^{L1}$ represents a hydrogen atom, a fluorine atom, a methyl group or a trifluoromethyl group.

Of these, the structural unit (III) is preferably a structural unit having a lactone structure, more preferably a structural unit having a norbornanelactone structure, a structural unit having an oxynorbornanelactone structure and a structural unit having a γ-butyrolactone structure, and still more preferably a structural unit derived from norbornanelactone-yl (meth)acrylate, a structural unit derived from cyanonorbornanelactone-yl (meth)acrylate, a structural unit derived from oxynorbornanelactone-yl (meth)acrylate and a structural unit derived from butyrolactone-yl (meth)acrylate.

The lower limit of the proportion of the structural unit (III) contained with respect to the total structural units constituting the polymer (A) is preferably 20 mol %, more preferably 35 mol %, and still more preferably 45 mol %. The upper limit of the proportion is preferably 70 mol %, more preferably 65 mol %, and still more preferably 60 mol %. When the proportion falls within the above range, the LWR performance, etc., of the radiation-sensitive resin composition can be further improved. Furthermore, the adhesiveness of the resist pattern formed from the radiation-sensitive resin composition to the substrate can be more improved.

Structural Unit (IV)

The structural unit (IV) includes an alcoholic hydroxyl group and is other than the structural unit (I). When the polymer (A) further has the structural unit (IV), the solubility in a developer solution can be further adjusted, and consequently, the LWR performance, etc., of the radiation-sensitive resin composition can be more improved.

The structural unit (IV) is exemplified by structural units represented by the following formulae, and the like.

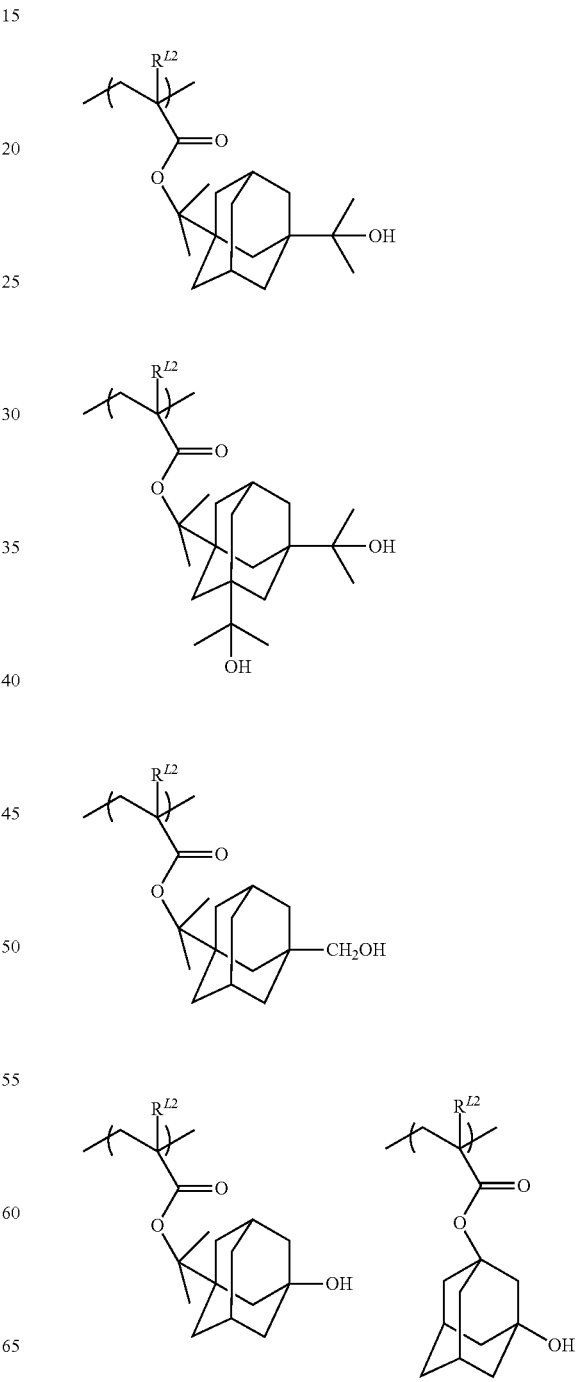

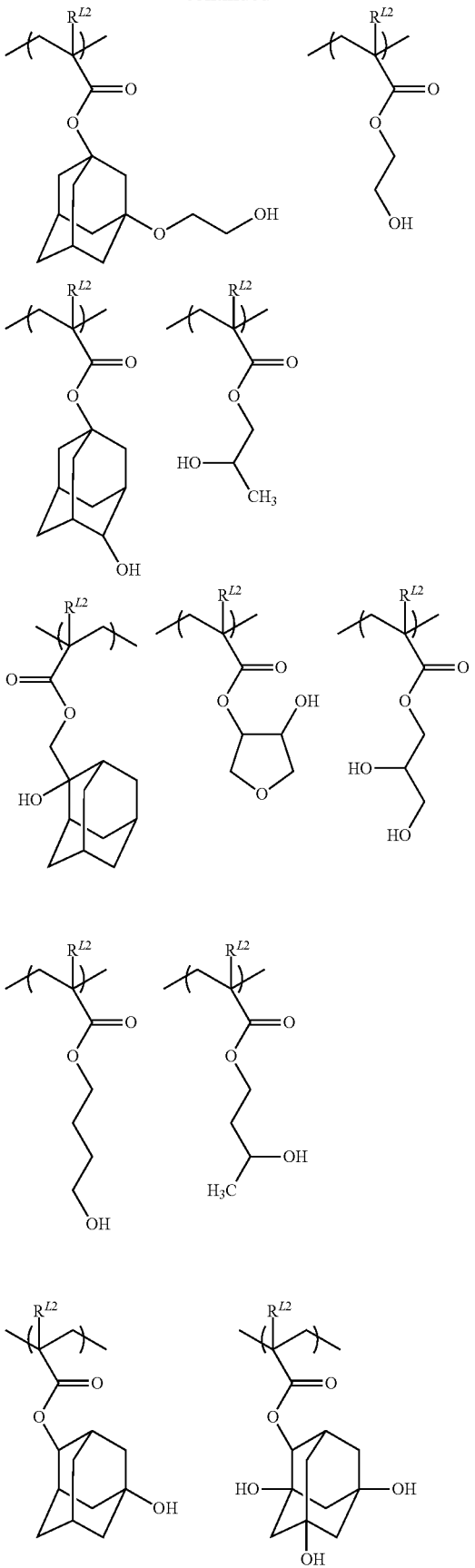

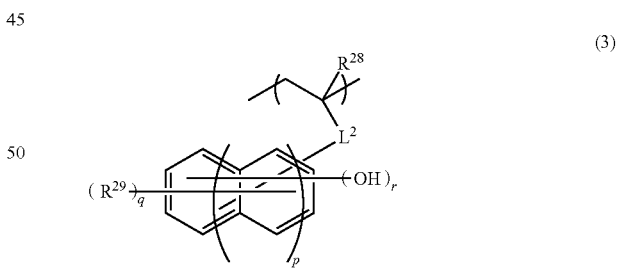

In the above formula, $R^{L2}$ represents a hydrogen atom, a fluorine atom, a methyl group or a trifluoromethyl group.

Of these, a structural unit derived from 3-hydroxyadamantan-1-yl (meth)acrylate is preferred.

The lower limit of the proportion of the structural unit (IV) contained with respect to the total structural units constituting the polymer (A) is preferably 3 mol %, more preferably 10 mol %, and still more preferably 15 mol %. The upper limit of the proportion is preferably 50 mol %, more preferably 40 mol %, and still more preferably 30 mol %. When the proportion falls within the above range, the LWR performance, etc., of the radiation-sensitive resin composition can be further improved.

Structural Unit (V)

The structural unit (V) includes a phenolic hydroxyl group. When the polymer (A) further has the structural unit (V), the solubility in a developer solution can be more adequately adjusted, and consequently, the LWR performance, etc., of the radiation-sensitive resin composition can be more improved. Furthermore, the adhesiveness of the resulting resist pattern to the substrate can be improved. In addition, in the case where an exposure to KrF, EUV or an electron beam is carried out, the sensitivity of the radiation-sensitive resin composition can be enhanced.

The structural unit (V) is exemplified by a structural unit represented by the following formula (3) (hereinafter, may be also referred to as "structural unit (V-1)"), and the like.

(3)

In the above formula (3), $R^{28}$ represents a hydrogen atom or a methyl group; $L^2$ represents a single bond or a divalent organic group having 1 to 20 carbon atoms; $R^{29}$ represents a monovalent organic group having 1 to 20 carbon atoms; q is an integer of 0 to 9, wherein in a case where q is no less than 2, a plurality of $R^{29}$s may be identical or different; r is an integer of 1 to 3; and p is an integer of 0 to 2.

The structural unit (V) is exemplified by structural units represented by the following formulae (3-1) to (3-6) (hereinafter, may be also referred to as "structural units (V-1) to (V-6)"), and the like.

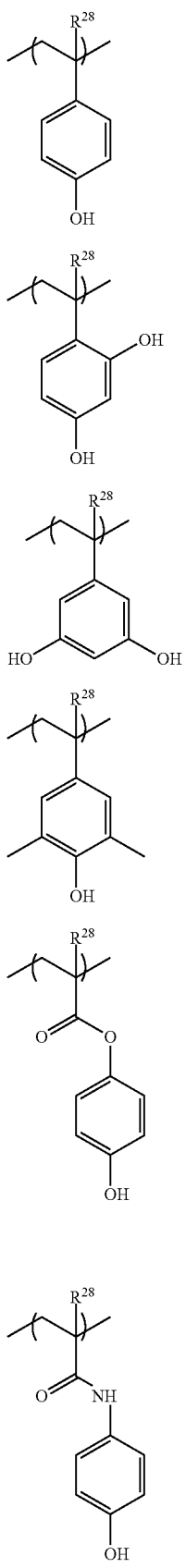

(3-1)

(3-2)

(3-3)

(3-4)

(3-5)

(3-6)

In the above formulae (3-1) to (3-6), $R^{28}$ is as defined in the above formula (3).

Of these, the structural unit (V-1) is preferred.

The lower limit of the proportion of the structural unit (V) contained with respect to the total structural units constituting the polymer (A) is preferably 10 mol %, more preferably 25 mol %, and still more preferably 40 mol %. The upper limit of the proportion is preferably 80 mol %, more preferably 70 mol %, and still more preferably 65 mol %. When the proportion of the structural unit (V) falls within the above range, the LWR performance, etc., of the radiation-sensitive resin composition can be further improved. In addition, in the case where an exposure to KrF, EUV or an electron beam is carried out, the sensitivity can be more enhanced.

Structural Unit (VI)

The structural unit (VI) includes the group (z) having a hydroxy group at the end thereof and at least one fluorine atom or fluorinated alkyl group on a carbon atom adjacent to the hydroxy group. When the polymer (A) has the structural unit (VI), the solubility in a developer solution can be more adequately adjusted, and consequently the LWR performance, etc., of the radiation-sensitive resin composition can be more improved. Moreover, in the case where an exposure to EUV is carried out, the sensitivity of the radiation-sensitive resin composition can be enhanced.

The group (z) is exemplified by a group represented by the following formula (z-1), and the like.

(z-1)

In the above formula (z-1), $R^{f1}$ and $R^{f2}$ each independently represent an alkyl group having 1 to 10 carbon atoms or a fluorinated alkyl group having 1 to 10 carbon atoms, wherein at least any one of $R^{f1}$ and $R^{f2}$ represent a fluorinated alkyl group.

Examples of the fluorinated alkyl group having 1 to 10 carbon atoms which may be represented by $R^{f1}$ or $R^{f2}$ include a fluoromethyl group, a difluoromethyl group, a trifluoromethyl group, a fluoroethyl group, a difluoroethyl group, a trifluoroethyl group, a pentafluoroethyl group, a hexafluoropropyl group, a heptafluoropropyl group, a nonafluorobutyl group, and the like.

Of these, the trifluoromethyl group and the pentafluoroethyl group are preferred, and the trifluoromethyl group is more preferred.

The group (z) is preferably a hydroxy-di(trifluoromethyl)methyl group, a hydroxy-di(pentafluoroethyl)methyl group or a hydroxy-methyl-trifluoromethylmethyl group, and more preferably a hydroxy-di(trifluoromethyl)methyl group.

The structural unit (VI) is exemplified by structural units represented by the following formulae (4-1) to (4-6) (hereinafter, may be also referred to as "structural units (VI-1) to (VI-6)"), and the like.

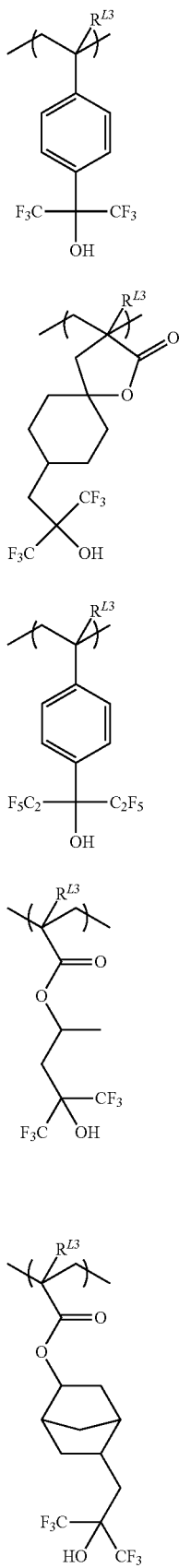

(4-1)

(4-2)

(4-3)

(4-4)

(4-5)

(4-6)

In the above formulae (4-1) to (4-6), $R^{L3}$s each independently represent a hydrogen atom or a methyl group.

Of these, the structural unit (VI-1) and the structural unit (VI-2) are preferred.

The lower limit of the proportion of the structural unit (VI) contained with respect to the total structural units constituting the polymer (A) is preferably 5 mol %, more preferably 15 mol %, and still more preferably 25 mol %. The upper limit of the proportion is preferably 60 mol %, more preferably 50 mol %, and still more preferably 45 mol %. When the proportion of the structural unit (VI) falls within the above range, the radiation-sensitive resin composition enables the LWR performance, etc., to be further improved. Moreover, the sensitivity upon exposures to KrF, EUV and an electron beam can be further enhanced.

The polymer (A) may also have other structural unit than the structural units (I) to (VI). The other structural unit is exemplified by a structural unit that includes a fluorine atom, a structural unit that includes an alicyclic hydrocarbon group, and the like. The upper limit of the proportion of the other structural unit contained is preferably 30 mol %, and more preferably 20 mol %.

The lower limit of the content of the polymer (A) with respect to the total solid content of the radiation-sensitive resin composition is preferably 70% by mass, more preferably 80% by mass, and still more preferably 85% by mass.

Synthesis Method of Polymer (A)

The polymer (A) may be synthesized by, for example, polymerizing monomers that give each structural unit in an appropriate solvent using a radical polymerization initiator or the like.

Examples of the radical polymerization initiator include: azo radical initiators such as azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile) and dimethyl 2,2'-azobisisobutyrate; peroxide radical initiators such as benzoyl peroxide, t-butyl hydroperoxide and cumene hydroperoxide; and the like. Of these, AIBN and dimethyl 2,2'-azobisisobutyrate are preferred, and AIBN is more preferred. These radical initiators may be used either alone of one type, or as a mixture of two or more types thereof.

Examples of the solvent used in the polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

halogenated hydrocarbons such as chlorobutanes, bromohexanes, dichloroethanes, hexamethylene dibromide and chlorobenzene;

saturated carboxylic acid esters such as ethyl acetate, n-butyl acetate, i-butyl acetate and methyl propionate;

ketones such as acetone, methyl ethyl ketone, 4-methyl-2-pentanone and 2-heptanone;

ethers such as tetrahydrofuran, dimethoxyethanes and diethoxyethanes;

alcohols such as methanol, ethanol, 1-propanol, 2-propanol and 4-methyl-2-pentanol; and the like. These solvents used in the polymerization may be used either alone, or two or more types thereof may be used in combination.

The lower limit of the reaction temperature in the polymerization is typically 40° C., and preferably 50° C. The upper limit of the reaction temperature is typically 150° C., and preferably 120° C. The lower limit of the reaction time period is typically 1 hour. The upper limit of the reaction time period is typically 48 hrs, and preferably 24 hrs.

The polystyrene equivalent weight average molecular weight (Mw) of the polymer (A) as determined by gel permeation chromatography (GPC) is not particularly limited, and the lower limit of the Mw is preferably 1,000, more preferably 2,000, still more preferably 3,000, and particularly preferably 5,000. The upper limit of the Mw is preferably 50,000, more preferably 30,000, still more preferably 20,000, and particularly preferably 10,000. When the Mw of the polymer (A) falls within the above range, the application property and inhibitory ability of development defects of the radiation-sensitive resin composition may be improved. When the Mw of the polymer (A) is less than the lower limit, a resist film exhibiting sufficient heat resistance may not be obtained. When the Mw of the polymer (A) is greater than the upper limit, developability of the resist film may be deteriorated.

The lower limit of the ratio (Mw/Mn) of the Mw to the polystyrene equivalent number average molecular weight (Mn) as determined by GPC of the polymer (A) is typically 1. The upper limit of the ratio (Mw/Mn) is typically 5, preferably 3, and more preferably 2.

As used herein, the Mw and the Mn of the polymer are determined using gel permeation chromatography (GPC) under the following conditions.

GPC columns: "G2000 HXL"×2, "G3000 HXL"×1, and "G4000 HXL"×1 available from Tosoh Corporation;
column temperature: 40° C.;
elution solvent: tetrahydrofuran (available from Wako Pure Chemical Industries, Ltd.);
flow rate: 1.0 mL/min;
sample concentration: 1.0% by mass;
amount of injected sample: 100 µL;
detector: differential refractometer; and
standard substance: mono-dispersed polystyrene.

(B) Acid Generator

The acid generator (B) is a substance that generates an acid upon an exposure. The acid thus generated allows the acid-labile group, etc., included in the structural unit (I) of the polymer (A) to be dissociated, thereby generating a carboxy group or the like. As a result, the solubility of these polymers in a developer solution is altered, whereby a resist pattern can be formed from the radiation-sensitive resin composition. The acid generator (B) may be contained in the radiation-sensitive resin composition either in the form of a low molecular weight compound as described later (hereinafter, may be also referred to as "(B) acid generating agent" or "acid generating agent (B)", as appropriate), or in the form incorporated as a part of the polymer, or in both of these forms.

The acid generating agent (B) is exemplified by onium salt compounds, N-sulfonyloxyimide compounds, halogen-containing compounds, diazo ketone compounds, and the like.

Examples of the onium salt compounds include sulfonium salts, tetrahydrothiophenium salts, iodonium salts, phosphonium salts, diazonium salts, pyridinium salts, and the like.

Examples of the sulfonium salt include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium 2-bicyclo[2.2.1]hept-2-yl-1,1-difluoroethanesulfonate, triphenylsulfonium camphorsulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethane sulfonate, 4-cyclohexylphenyldiphenylsulfonium camphorsulfonate, 4-methane sulfonylphenyldiphenylsulfonium trifluoromethanesulfonate, 4-methane sulfonylphenyldiphenylsulfonium nonafluoro-n-butanesulfonate, 4-methane sulfonylphenyldiphenylsulfonium perfluoro-n-octanesulfonate, 4-methane sulfonylphenyldiphenylsulfonium 2-bicyclo[2.2.1]hept-2-yl-1,1,2,2-tetrafluoroethanesulfonate, 4-methanesulfonylphenyldiphenylsulfonium camphorsulfonate, triphenylsulfonium 1,1,2,2-tetrafluoro-6-(1-adamantanecarbonyloxy)-hexane-1-sulfonate, and the like.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium camphorsulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium camphorsulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium camphorsulfonate, and the like.

Examples of the iodonium salt include diphenyliodonium tri fluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium camphorsulfonate, and the like.

Examples of the N-sulfonyloxyimide compound include N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, N-(2-(3-tetracyclo[4.4.0.1$^{2,5}$.1$^{7,10}$]dodecanyl)-1,1-difluoroethanesulfonyloxy)bicyclo[2.2.1]hept-5-ene-2,3-dicarboxyimide, N-(camphorsulfonyloxy)bicyclo[2.2.1]hept-5-ene-2,3-dicarboxyimide, and the like.

The acid generating agent (B) is preferably a compound represented by the following formula (5). When the acid generating agent (B) has the following structure, it is expected that a diffusion length of the acid generated upon the exposure in a resist film will be more properly decreased through e.g., an interaction with the polar structure included in the polymer (A) and/or the like, and consequently, the LWR performance, etc., of the radiation-sensitive resin composition can be more improved.

$$R^{30}-R^{31}-SO_3^-X^+ \quad (5)$$

In the above formula (5), $R^{30}$ represents a monovalent group that includes an alicyclic structure having 6 or more ring atoms or a monovalent group that includes an aliphatic heterocyclic structure having 6 or more ring atoms; $R^{31}$ represents a fluorinated alkanediyl group having 1 to 10 carbon atoms; and $X^+$ represents a monovalent radioactive ray-labile onium cation.

In regard to $R^{30}$, the number of "ring atoms" as referred to means the number of atoms constituting a ring of the alicyclic structure or the aliphatic heterocyclic structure, and in the case of polycyclic alicyclic structures and polycyclic aliphatic heterocyclic structures, the "ring atoms" means the number of atoms constituting the polycycle.

Examples of the monovalent group that includes an alicyclic structure having 6 or more ring atoms which may be represented by $R^{30}$ include:

monocyclic cycloalkyl groups such as a cyclooctyl group, a cyclononyl group, a cyclodecyl group and a cyclododecyl group;

monocyclic cycloalkenyl groups such as a cyclooctenyl group and a cyclodecenyl group;

polycyclic cycloalkyl group such as a norbornyl group, an adamantyl group, a tricyclodecyl group and a tetracyclododecyl group;

polycyclic cycloalkenyl groups such as a norbornenyl group and a tricyclodecenyl group; and the like.

Examples of the monovalent group that includes an aliphatic heterocyclic structure having 6 or more ring atoms which may be represented by $R^{30}$ include:

groups that have a lactone structure, such as a norbornanelactone-yl group;

groups that have a sultone structure, such as a norbornanesultone-yl group;

oxygen atom-containing heterocyclic groups such as an oxacycloheptyl group and an oxanorbornyl group;

nitrogen atom-containing heterocyclic groups such as an azacyclohexyl group, an azacycloheptyl group and a diazabicyclooctan-yl group;

sulfur atom-containing heterocyclic groups such as a thiacycloheptyl group and a thianorbornyl group; and the like.

In light of attaining a further proper diffusion length of the acid described above, the number of ring atoms included in the group represented by $R^{30}$ is preferably no less than 8, more preferably 9 to 15, and still more preferably 10 to 13.

Of these, $R^{30}$ represents preferably a monovalent group that includes an alicyclic structure having 9 or more ring atoms, or a monovalent group that includes an aliphatic heterocyclic structure having 9 or more ring atoms, more preferably an adamantyl group, a hydroxyadamantyl group, a norbornanelactone-yl group, or a 5-oxo-4-oxatricyclo [4.3.1.1$^{3,8}$]undecan-yl group, and still more preferably an adamantyl group.

Examples of the fluorinated alkanediyl group having 1 to 10 carbon atoms represented by $R^{31}$ include groups obtained by substituting with a fluorine atom, one or more hydrogen atoms included in an alkanediyl group having 1 to 10 carbon atoms such as a methanediyl group, an ethanediyl group or a propanediyl group, and the like.

Of these, a fluorinated alkanediyl group in which a fluorine atom bonds to a carbon atom adjacent to the $SO_3^-$ group is preferred, a fluorinated alkanediyl group in which two fluorine atoms bond to a carbon atom adjacent to the $SO_3^-$ group is more preferred, and a 1,1-difluoromethanediyl group, a 1,1-difluoroethanediyl group, a 1,1,3,3,3-pentafluoro-1,2-propanediyl group, a 1,1,2,2-tetrafluoroethanediyl group, a 1,1,2,2-tetrafluorobutanediyl group and a 1,1,2,2-tetrafluorohexanediyl group are still more preferred.

The monovalent radioactive ray-labile onium cation represented by $X^+$ is a cation that is degraded upon an irradiation with exposure light. At light-exposed regions, a sulfonic acid is generated from the sulfonate anion and a proton generated through degradation of the radioactive ray-labile onium cation. The monovalent radioactive ray-labile onium cation represented by $X^+$ is exemplified by radioactive ray-labile onium cations that contain an element such as S, I, O, N, P, Cl, Br, F, As, Se, Sn, Sb, Te and Bi. Examples of the cation that contains S (sulfur) as the element include a sulfonium cation, tetrahydrothiophenium cation and the like, and examples of the cation that contains I (iodine) as the element include an iodonium cation and the like. Of these, a sulfonium cation represented by the following formula (X-1), a tetrahydrothiophenium cation represented by the following formula (X-2) and an iodonium cation represented by the following formula (X-3) are preferred.

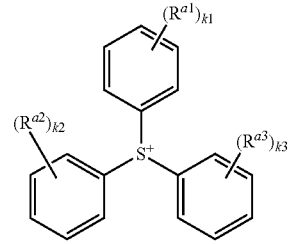

(X-1)

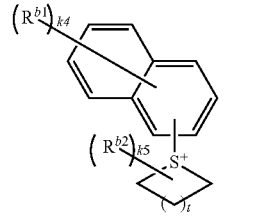

(X-2)

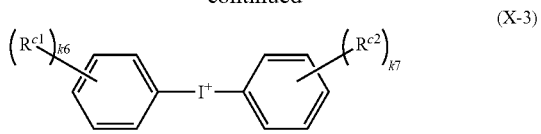

(X-3)

In the above formula (X-1), $R^{a1}$, $R^{a2}$ and $R^{a3}$ each independently represent a substituted or unsubstituted linear or branched alkyl group having 1 to 12 carbon atoms, a substituted or unsubstituted aromatic hydrocarbon group having 6 to 12 carbon atoms, —OSO$_2$—$R^P$ or —SO$_2$—$R^Q$, or at least two of $R^{a1}$, $R^{a2}$ and $R^{a3}$ taken together represent a ring structure, and the rest of $R^{a1}$, $R^{a2}$ and $R^{a3}$ represents a substituted or unsubstituted linear or branched alkyl group having 1 to 12 carbon atoms, a substituted or unsubstituted aromatic hydrocarbon group having 6 to 12 carbon atoms, —OSO$_2$—$R^P$ or —SO$_2$—$R^Q$; $R^P$ and $R^Q$ each independently represent a substituted or unsubstituted linear or branched alkyl group having 1 to 12 carbon atoms, a substituted or unsubstituted alicyclic hydrocarbon group having 5 to 25 carbon atoms or a substituted or unsubstituted aromatic hydrocarbon group having 6 to 12 carbon atoms; and k1, k2 and k3 are each independently an integer of 0 to 5, wherein $R^{a1}$ to $R^{a3}$, $R^P$ and $R^Q$ are each present in a plurality of number, a plurality of $R^{a1}$s may be identical or different, a plurality of $R^{a2}$s may be identical or different, a plurality of $R^{a3}$s may be identical or different, a plurality of $R^P$s may be identical or different, and a plurality of $R^Q$s may be identical or different.

In the above formula (X-2), $R^{b1}$ represents a substituted or unsubstituted linear or branched alkyl group having 1 to 8 carbon atoms, or a substituted or unsubstituted aromatic hydrocarbon group having 6 to 8 carbon atoms; k4 is an integer of 0 to 7, wherein in a case where $R^{b1}$ is present in a plurality of number, a plurality of $R^{b1}$s may be identical or different, or the plurality of $R^{b1}$s may taken together represent a ring structure; $R^{b2}$ represents a substituted or unsubstituted linear or branched alkyl group having 1 to 7 carbon atoms, or a substituted or unsubstituted aromatic hydrocarbon group having 6 or 7 carbon atoms; k5 is an integer of 0 to 6, wherein in a case where $R^{b2}$ is present in a plurality of number, a plurality of $R^{b2}$s may be identical or different, or the plurality of $R^{b2}$s may taken together represent a ring structure; and t is an integer of 0 to 3.

In the above formula (X-3), $R^{c1}$ and $R^{c2}$ each independently represent a substituted or unsubstituted linear or branched alkyl group having 1 to 12 carbon atoms, a substituted or unsubstituted aromatic hydrocarbon group having 6 to 12 carbon atoms, —OSO$_2$—$R^R$ or —SO$_2$—$R^S$, or at least two of these groups may taken together represent a ring structure; $R^R$ and $R^S$ each independently represent a substituted or unsubstituted linear or branched alkyl group having 1 to 12 carbon atoms, a substituted or unsubstituted alicyclic hydrocarbon group having 5 to 25 carbon atoms or a substituted or unsubstituted aromatic hydrocarbon group having 6 to 12 carbon atoms; k6 and k7 are each independently an integer of 0 to 5, wherein in a case where $R^{c1}$, $R^{c2}$, $R^R$ and $R^S$ are each a plurality of number, a plurality of $R^{c1}$s may be identical or different, a plurality of $R^{c2}$s may be identical or different, a plurality of $R^R$s may be identical or different, and a plurality of $R^S$s may be identical or different.

Examples of the unsubstituted linear alkyl group which may be represented by $R^{a1}$, $R^{a2}$, $R^{a3}$, $R^{b1}$, $R^{b2}$, $R^{c1}$ or $R^{c2}$ include a methyl group, an ethyl group, a n-propyl group, a n-butyl group, and the like.

Examples of the unsubstituted branched alkyl group which may be represented by $R^{a1}$, $R^{a2}$, $R^{a3}$, $R^{b1}$, $R^{b2}$, $R^{c1}$ or $R^{c2}$ include an i-propyl group, an i-butyl group, a sec-butyl group, a t-butyl group, and the like.

Examples of the unsubstituted aromatic hydrocarbon group which may be represented by $R^{a1}$, $R^{a2}$, $R^{a3}$, $R^{b1}$, $R^{b2}$, $R^{c1}$ or $R^{c2}$ include: aryl groups such as a phenyl group, a tolyl group, a xylyl group, a mesityl group and a naphthyl group; aralkyl groups such as a benzyl group and a phenethyl group; and the like.

Examples of the unsubstituted aromatic hydrocarbon group which may be represented by $R^{b1}$ or $R^{b2}$ include a phenyl group, a tolyl group, a benzyl group, and the like.

Examples of the substituent which may substitute for a hydrogen atom included in the alkyl group or aromatic hydrocarbon group include halogen atoms such as a fluorine atom, a chlorine atom, a bromine atom and an iodine atom, a hydroxy group, a carboxy group, a cyano group, a nitro group, an alkoxy group, an alkoxycarbonyl group, an alkoxycarbonyloxy group, an acyl group, an acyloxy group, and the like.

Of these, the halogen atoms are preferred, and the fluorine atom is more preferred.

$R^{a1}$ to $R^{a3}$, $R^{b1}$, $R^{b2}$, $R^{c1}$ and $R^{c2}$ each independently represent preferably an unsubstituted linear or branched alkyl group, a fluorinated alkyl group, an unsubstituted monovalent aromatic hydrocarbon group, —OSO$_2$—R", or —SO$_2$—R", more preferably a fluorinated alkyl group or an unsubstituted monovalent aromatic hydrocarbon group, and still more preferably a fluorinated alkyl group, wherein R" represents an unsubstituted monovalent alicyclic hydrocarbon group or an unsubstituted monovalent aromatic hydrocarbon group.

In the above formula (X-1), k1, k2 and k3 are each preferably an integer of 0 to 2, more preferably 0 or 1, and still more preferably 0.

In the above formula (X-2), k4 is preferably an integer of 0 to 2, more preferably 0 or 1, and still more preferably 1; and k5 is preferably an integer of 0 to 2, more preferably 0 or 1, and still more preferably 0.

In the above formula (X-3), k6 and k7 are each preferably an integer of 0 to 2, more preferably 0 or 1, and still more preferably 0.

The acid generating agent represented by the above formula (5) is exemplified by compounds represented by the following formulae (5-1) to (5-13) (hereinafter, may be also referred to as "compounds (5-1) to (5-13)"), and the like.

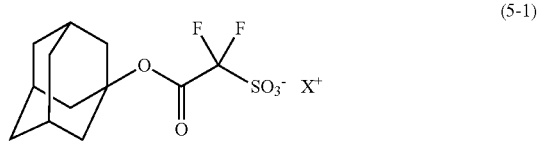

(5-1)

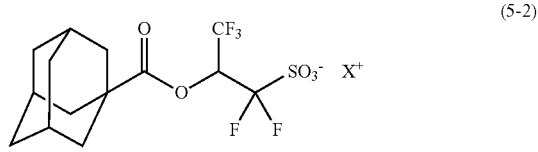

(5-2)

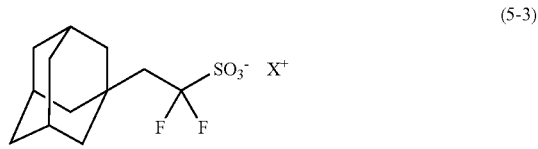

(5-3)

(5-4) 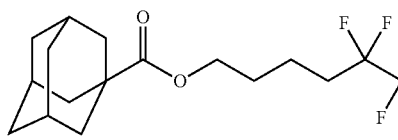

(5-5) 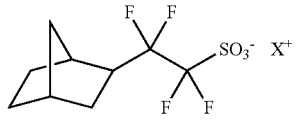

(5-6) 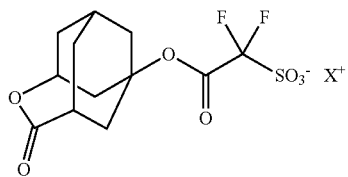

(5-7) 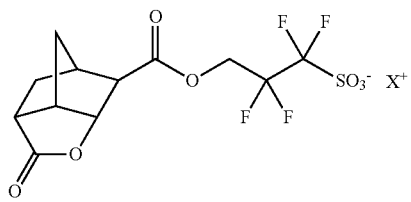

(5-8) 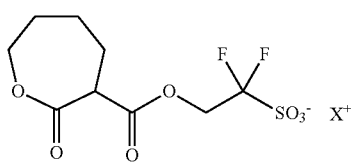

(5-9) 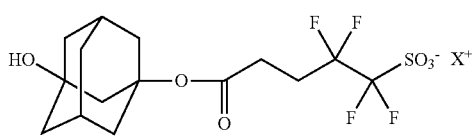

(5-10) 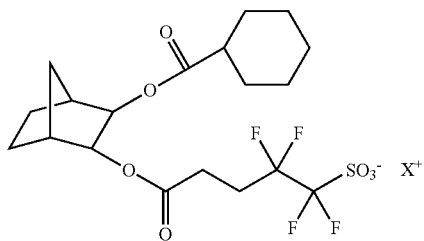

(5-11) 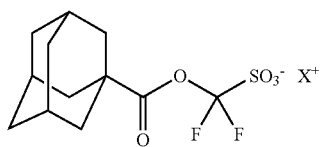

(5-12) 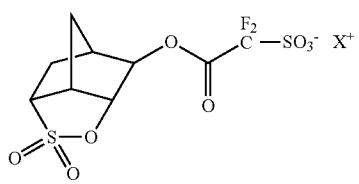

(5-13) 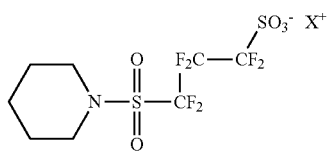

In the above formulae (5-1) to (5-13), $X^+$ is as defined in the above formula (5).

Of these, the acid generating agent (B) is preferably an onium salt compound, more preferably a sulfonium salt, still more preferably a sulfonium salt having an adamantane structure-containing anion, a sulfonium salt having a norbornanesultone structure-containing anion or a sulfonium salt having a sulfonamide structure, and particularly preferably the compound (5-1), the compound (5-2), the compound (5-12) or the compound (5-13).

In addition, as the acid generator (B), a polymer having a structural unit represented by the following formula (5-14) is also preferred.

(5-14) 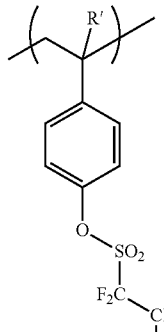

In the above formula (5-14), R' represents a hydrogen atom or a methyl group; and $X^+$ is as defined in the above formula (5).

In a case where the acid generator (B) is the acid generating agent (B), in light of ensuring the sensitivity and developability of the radiation-sensitive resin composition, the lower limit of the content of the acid generator (B) with respect to 100 parts by mass of the polymer (A) is preferably 0.1 parts by mass, more preferably 0.5 parts by mass, still more preferably 1 part by mass, and particularly preferably 3 parts by mass. The upper limit of the content is preferably 40 parts by mass, more preferably 30 parts by mass, and still more preferably 25 parts by mass. When the content of the acid generating agent (B) falls within the above range, the sensitivity and the developability of the radiation-sensitive resin composition are more improved, and consequently, the LWR performance, etc., can be more improved. Either one, or two or more types of the acid generator (B) may be used.

(C) Acid Diffusion Controller

The radiation-sensitive resin composition may contain the acid diffusion controller (C) as needed.

The acid diffusion controller (C) achieves the effect of controlling a diffusion phenomenon of the acid generated from the acid generator (B) upon an exposure in the resist film, and inhibiting unfavorable chemical reactions at light-unexposed regions, whereby the storage stability of the resulting radiation-sensitive resin composition is further improved. Furthermore, a resolution for use as a resist is further improved, while variation of the line width of the resist pattern caused by variation of post exposure time delay from the exposure until a development treatment can be inhibited, which enables a radiation-sensitive resin composition with superior process stability to be obtained. The acid diffusion controller (C) may be contained in the radiation-sensitive resin composition in the form of a free compound (hereinafter, may be also referred to as "(C) acid diffusion control agent" or "acid diffusion control agent (C)", as appropriate), or in the form incorporated as a part of the polymer, or in both of these forms.

The acid diffusion control agent (C) is exemplified by a compound represented by the following formula (6a) (hereinafter, may be also referred to as "nitrogen-containing compound (I)"), a compound having two nitrogen atoms in a single molecule (hereinafter, may be also referred to as "nitrogen-containing compound (II)"), a compound having three nitrogen atoms (hereinafter, may be also referred to as "nitrogen-containing compound (III)"), an amide group-containing compound, a urea compound, a nitrogen-containing heterocyclic compound, and the like.

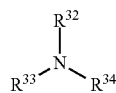

(6a)

In the above formula (6a), $R^{32}$, $R^{33}$ and $R^{34}$ each independently represent a hydrogen atom, an unsubstituted or substituted linear, branched or cyclic alkyl group, an unsubstituted or substituted aryl group or an unsubstituted or substituted aralkyl group.

Examples of the nitrogen-containing compound (I) include: monoalkylamines such as n-hexylamine; dialkylamines such as di-n-butylamine; trialkylamines such as triethylamine and tri-n-pentylamine; aromatic amines such as aniline; and the like.

Examples of the nitrogen-containing compound (II) include ethylenediamine, N,N,N',N'-tetramethylethylenediamine, and the like.

Examples of the nitrogen-containing compound (III) include: polyamine compounds such as polyethyleneimine and polyallylamine; polymers of dimethylaminoethylacrylamide, etc.; and the like.

Examples of the amide group-containing compound include formamide, N-methylformamide, N,N-dimethylformamide, acetamide, N-methyl acetamide, N,N-dimethylacetamide, propionamide, benzamide, pyrrolidone, N-methylpyrrolidone, and the like.

Examples of the urea compound include urea, methylurea, 1,1-dimethylurea, 1,3-dimethylurea, 1,1,3,3-tetramethylurea, 1,3-diphenylurea, tributylthiourea, and the like.

Examples of the nitrogen-containing heterocyclic compound include: pyridines such as pyridine and 2-methylpyridine; morpholines such as N-propylmorpholine and N-(undecan-1-ylcarbonyloxyethyl)morpholine; pyrazines; pyrazoles; and the like.

A compound having an acid-labile group may also be used as the nitrogen-containing organic compound. Examples of the nitrogen-containing organic compound having an acid-labile group include N-t-butoxycarbonylpiperidine, N-t-butoxycarbonyl imidazole, N-t-butoxycarbonylbenzimidazole, N-t-butoxycarbonyl-2-phenylbenzimidazole, N-(t-butoxycarbonyl)di-n-octylamine, N-(t-butoxycarbonyl)diethanolamine, N-(t-butoxycarbonyl)dicyclohexylamine, N-(t-butoxycarbonyl)diphenylamine, N-t-butoxycarbonyl-4-hydroxypiperidine, N-t-amyloxycarbonyl-4-hydroxypiperidine, and the like.

A photolabile base which is sensitized upon an exposure to generate a weak acid may also be used as the acid diffusion control agent (C). The photolabile base is exemplified by an onium salt compound that loses acid diffusion controllability through degradation upon an exposure, and the like. The onium salt compound is exemplified by a sulfonium salt compound represented by the following formula (6b-1), an iodonium salt compound represented by the following formula (6b-2), and the like.

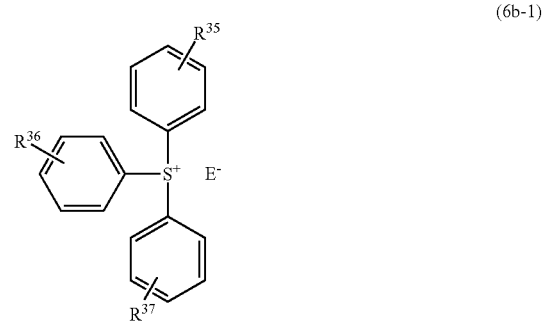

(6b-1)

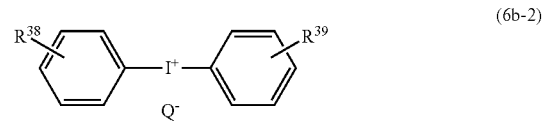

(6b-2)

In the above formula (6b-1) and formula (6b-2), $R^{35}$ to $R^{39}$ each independently represent a hydrogen atom, an alkyl group, an alkoxy group, a hydroxy group or a halogen atom; $E^-$ and $Q^-$ each independently represent $OH^-$, $R^\beta—COO^-$, $R^\beta—SO_3^-$ or an anion represented by the following formula (6b-3), wherein $R^\beta$ represents an alkyl group, an aryl group or an aralkyl group.

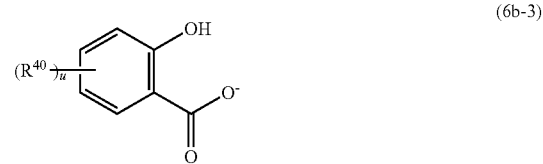

(6b-3)

In the above formula (6b-3), $R^{40}$ represents a linear or branched alkyl group having 1 to 12 carbon atoms, or a linear or branched alkoxyl group having 1 to 12 carbon atoms, wherein a part or all of hydrogen atoms included in the linear or branched alkyl group or the linear or branched alkoxyl group may be substituted with a fluorine atom; and u is an integer of 0 to 2.

The photodegradable base is exemplified by compounds represented by the following formulae, and the like.

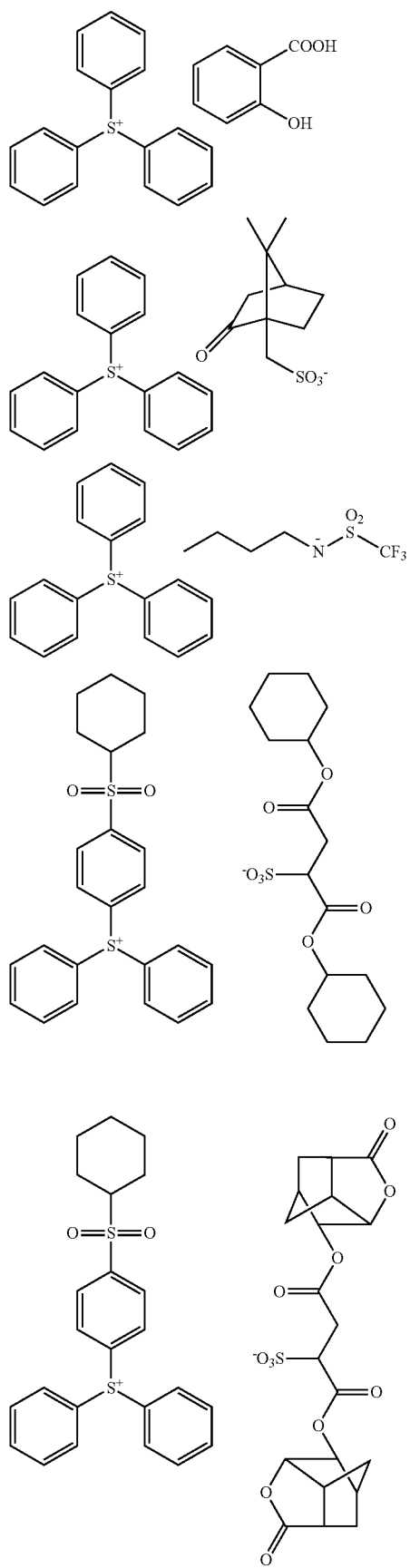
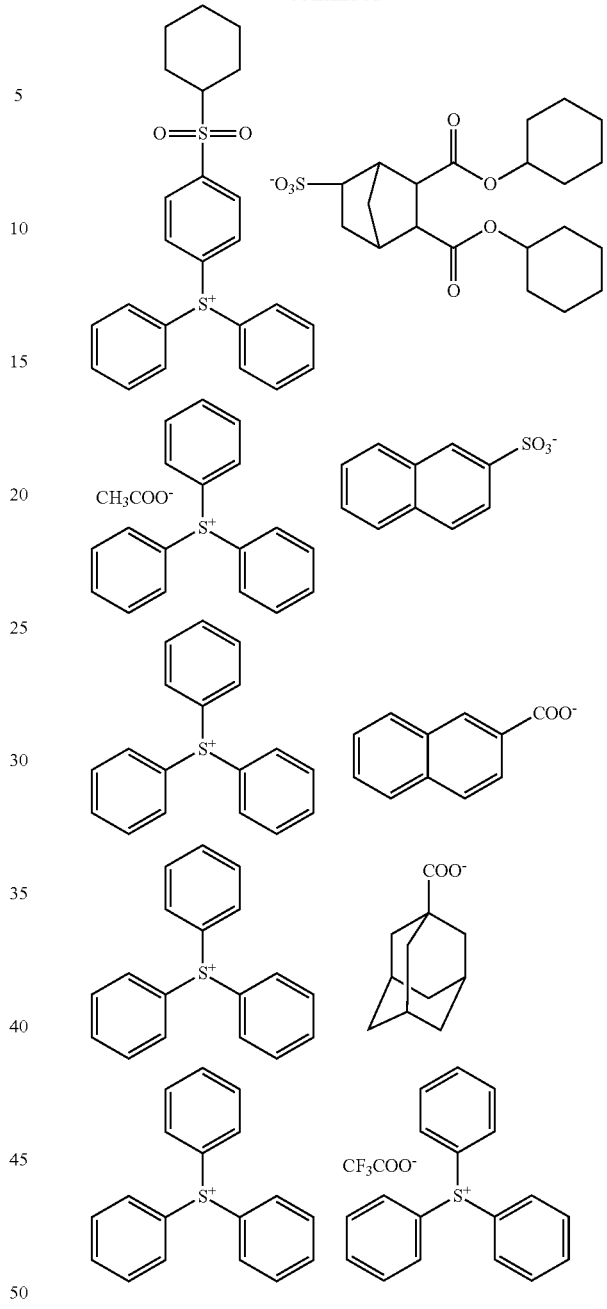

Of these, the photodegradable base is preferably a sulfonium salt, more preferably a triaryl sulfonium salt, and still more preferably triphenylsulfonium salicylate or triphenylsulfonium 10-camphorsulfonate.

In a case where the acid diffusion controller (C) is the acid diffusion control agent (C), the lower limit of the content of the acid diffusion controller (C) with respect to 100 parts by mass of the polymer (A) is preferably 0.1 parts by mass, more preferably 0.5 parts by mass, and still more preferably 1 part by mass. The upper limit of the content is preferably 20 parts by mass, more preferably 15 parts by mass, still more preferably 10 parts by mass, and particularly preferably 7 parts by mass. When the content of the acid diffusion control agent (C) falls within the above range, the resolution, storage stability and the like of the radiation-sensitive resin composition can be improved. When the content of the acid diffusion diffusion control agent (C) is greater than the upper limit, the sensitivity of the radiation-sensitive resin composition may be deteriorated.

(D) Solvent

The radiation-sensitive resin composition according to the embodiment of the present invention typically contains the solvent (D). The solvent (D) is not particularly limited as long as it is a solvent capable of dissolving or dispersing at least the polymer (A) and the acid generator (B), as well as the acid diffusion controller (C) and the like contained as desired.

The solvent (D) is exemplified by an alcohol solvent, an ether solvent, a ketone solvent, an amide solvent, an ester solvent, a hydrocarbon solvent, and the like.

Examples of the alcohol solvent include:

monohydric alcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol and benzyl alcohol and, diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether; and the like.

Examples of the ether solvent include:

dialkyl ether solvents such as diethyl ether, dipropyl ether and dibutyl ether;

cyclic ether solvents such as tetrahydrofuran and tetrahydropyran;

aromatic ring-containing ether solvents such as diphenyl ether and anisole; and the like.

Examples of the ketone solvent include:

chain ketone solvents such as acetone, methyl ethyl ketone, methyl-n-propyl ketone, methyl-n-butyl ketone, diethyl ketone, methyl-iso-butyl ketone, 2-heptanone, ethyl-n-butyl ketone, methyl-n-hexyl ketone, di-iso-butyl ketone and trimethylnonanone:

cyclic ketone solvents such as cyclopentanone, cyclohexanone, cycloheptanone, cyclooctanone and methylcyclohexanone:

2,4-pentanedione, acetonyl acetone, acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

acetic acid ester solvents such as methyl acetate, ethyl acetate, n-propyl acetate, iso-propyl acetate, n-butyl acetate, iso-butyl acetate, sec-butyl acetate, n-pentyl acetate, i-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate and n-nonyl acetate;

polyhydric alcohol partial ether acetate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate and dipropylene glycol monoethyl ether acetate;

lactone solvents such as γ-butyrolactone and δ-valerolactone;

carbonate solvents such as dimethyl carbonate, diethyl carbonate, ethylene carbonate and propylene carbonate;

glycol diacetate, methoxytriglycol acetate, ethyl propionate, n-butyl propionate, iso-amyl propionate, diethyl oxalate, di-n-butyl oxalate, methyl acetoacetate, ethyl acetoacetate, methyl lactate, ethyl lactate, n-butyl lactate, n-amyl lactate, diethyl malonate, dimethyl phthalate and diethyl phthalate, and the like.

Examples of the hydrocarbon solvent include:

aliphatic hydrocarbon solvents such as n-pentane, iso-pentane, n-hexane, iso-hexane, n-heptane, iso-heptane, 2,2,4-trimethylpentane, n-octane, iso-octane, cyclohexane and methylcyclohexane;

aromatic hydrocarbon solvents such as benzene, toluene, xylene, mesitylene, ethylbenzene, trimethylbenzene, methylethylbenzene, n-propylbenzene, iso-propylbenzene, diethyl benzene, iso-butylbenzene, triethylbenzene, di-iso-propylbenzene and n-amylnaphthalene; and the like.

Of these, ester solvents and ketone solvents are preferred; polyhydric alcohol partial ether acetate solvents and cyclic ketone solvents are more preferred; and propylene glycol monomethyl ether acetate and cyclohexanone are even more preferred. The radiation-sensitive resin composition may contain one type, or two or more types of the solvent (D).

Other Optional Components

In addition to the components (A) to (D) described above, the radiation-sensitive resin composition may contain as other optional component such as, for example, a fluorine atom-containing polymer, a surfactant, an alicyclic skeleton-containing compound, a sensitizing agent and the like. The radiation-sensitive resin composition may contain each one type, or two or more types in combination of these other optional components.

Fluorine Atom-Containing Polymer

The radiation-sensitive resin composition according to the embodiment of the present invention may further contain a fluorine atom-containing polymer (except for those corresponding to the polymer (A)). In the case where the radiation-sensitive resin composition contains the fluorine atom-containing polymer, this polymer tends to be localized in the surface region of the resist film due to oil repellent characteristics of the fluorine atom-containing polymer in the resist film, and consequently the elution of the acid generator, the acid diffusion controller, etc., into a liquid immersion medium may be inhibited in the liquid immersion lithography and the like. In addition, due to water repellent characteristics of the fluorine atom-containing polymer, an advancing contact angle of a liquid immersion medium on the resist film can be controlled to fall within a desired range, whereby generation of bubble defects can be inhibited. Further, a greater receding contact angle of the liquid immersion medium on the resist film is attained, whereby an exposure by high speed scanning without being accompanied by residual water beads is enabled. Thus, when the radiation-sensitive resin composition further contains the fluorine atom-containing polymer, a resist film suitable for liquid immersion lithography processes can be provided.

The fluorine atom-containing polymer is not particularly limited as long as a fluorine atom is contained, and preferably has a greater percentage content (% by mass) of fluorine atoms than that of the polymer (A) of the radiation-sensitive resin composition. The fluorine atom-containing polymer is exemplified by those having a structural unit derived from fluorine atom-containing (meth)acrylate or the like such as 1,1,1,3,3,3-hexafluoro-2-propyl (meth)acrylate or 1,1-difluoro-1-ethoxycarbonylbutan-2-yl (meth)acrylate, and the like.

The lower limit of the content of the fluorine atom-containing polymer with respect to 100 parts by mass of the polymer (A) is preferably 0.1 parts by mass, more preferably 0.5 parts by mass, and still more preferably 1 part by mass. The upper limit of the content is preferably 20 parts by mass, more preferably 15 parts by mass, and still more preferably 10 parts by mass.

Surfactant

The surfactant achieves the effect of improving the application property, striation, developability, and the like. Examples of the surfactant include: nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate; commercially available products such as KP341 (available from Shin-Etsu Chemical Co., Ltd.); Polyflow No. 75 and Polyflow No. 95 (each available from Kyoeisha Chemical Co., Ltd.); EFTOP EF301, EFTOP EF303 and EFTOP EF352 (each available from Tochem Products Co. Ltd.); Megaface F171 and Megaface F173 (each available from DIC); Fluorad FC430 and Fluorad FC431 (each available from Sumitomo 3M Limited); ASAHI GUARD AG710, Surflon S-382, Surflon SC-101, Surflon SC-102, Surflon SC-103, Surflon SC-104, Surflon SC-105 and Surflon SC-106 (each available from Asahi Glass Co., Ltd.); and the like. The upper limit of the content of the surfactant with respect to 100 parts by mass of the polymer (A) is typically 2 parts by mass.

Alicyclic Skeleton-Containing Compound

The alicyclic skeleton-containing compound achieves the effect of improving dry etching resistance, a pattern configuration, adhesiveness to a substrate, and the like.

Examples of the alicyclic skeleton-containing compound include:

adamantane derivatives such as 1-adamantanecarboxylic acid, 2-adamantanone and t-butyl 1-adamantanecarboxylate;

deoxycholic acid esters such as t-butyl deoxycholate, t-butoxycarbonylmethyl deoxycholate and 2-ethoxyethyl deoxycholate;

lithocholic acid esters such as t-butyl lithocholate, t-butoxycarbonylmethyl lithocholate and 2-ethoxyethyl lithocholate;

3-[2-hydroxy-2,2-bis(trifluoromethyl)ethyl]tetracyclo[4.4.0.1$^{2,5}$.1$^{7,10}$]dodecane, 2-hydroxy-9-methoxycarbonyl-5-oxo-4-oxa-tricyclo[4.2.1.0$^{3,7}$]nonane; and the like.

The upper limit of the content of the alicyclic skeleton-containing compound with respect to 100 parts by mass of the polymer (A) is typically 5 parts by mass.

Sensitizing Agent

The sensitizing agent exhibits the action of increasing the amount of the acid generated from the acid generating agent (B) or the like, and achieves the effect of improving "apparent sensitivity" of the radiation-sensitive resin composition.

Examples of the sensitizing agent include carbazoles, acetophenones, benzophenones, naphthalenes, phenols, biacetyl, eosin, rose bengal, pyrenes, anthracenes, phenothiazines, and the like. These sensitizing agents may be used either alone, or two or more types thereof may be used in combination.

The upper limit of the content of the sensitizing agent with respect to 100 parts by mass of the polymer (A) is typically 2 parts by mass.

Preparation Method of Radiation-Sensitive Resin Composition

The radiation-sensitive resin composition may be prepared, for example, by mixing the polymer (A) and the acid generator (B), the optional component added as needed such as the acid diffusion controller (C), and the solvent (D), in a certain ratio. After the mixing, the radiation-sensitive resin composition is preferably filtered through a filter having a pore size of about 0.2 μm, for example. The lower limit of the solid content concentration of the radiation-sensitive resin composition typically 0.1% by mass, preferably 0.5% by mass, and more preferably 1% by mass. The upper limit of the solid content concentration is typically 50% by mass, preferably 30% by mass, and more preferably 20 parts by mass %.

The radiation-sensitive resin composition according to the embodiment of the present invention may be used for positive type pattern formation in which an alkaline developer solution is used, and also for negative type pattern formation in which a developer solution containing an organic solvent is used.

Since the radiation-sensitive resin composition includes an aromatic ring in the structural unit (I) of the polymer (A) contained therein, the radiation-sensitive resin composition can be suitably used for an exposure to a KrF excimer laser beam, an electron beam or an extreme ultraviolet ray (EUV), in particular.

Resist Pattern-Forming Method

The resist pattern-forming method includes the steps of: forming a resist film (hereinafter, may be also referred to as "resist film-forming step"); exposing the resist film (hereinafter, may be also referred to as "exposure step"); and developing the resist film exposed (hereinafter, may be also referred to as "development step"), wherein the resist film is formed from the radiation-sensitive resin composition.

According to the resist pattern-forming method of this embodiment, since the radiation-sensitive resin composition described above is used, a resist pattern exhibiting low LWR and superior CDU, a high resolution, and superior rectangularity of cross-sectional shape can be formed, while a great depth of focus and exposure latitude are exhibited. Hereinafter, each step will be described.

Resist Film-Forming Step

In this step, a resist film is formed using the radiation-sensitive resin composition described above. The substrate on which the resist film is formed is exemplified by a conventionally well-known substrate such as a silicon wafer, a wafer coated with silicon dioxide or aluminum, and the like. In addition, an organic or inorganic antireflective film disclosed in, for example, Japanese Examined Patent Application, Publication No. H6-12452, Japanese Unexamined Patent Application, Publication No. S59-93448, or the like may be formed on the substrate. An application procedure is exemplified by spin-coating, cast coating, roll-coating, and the like. After the application, prebaking (PB) may be carried out as needed for evaporating the solvent remaining in the coating film. The lower limit of the temperature for PB is typically 60° C., and preferably 80° C. The upper limit of the temperature for PB is typically 140° C., and preferably 120° C. The lower limit of the time period for PB is typically 5 sec, and preferably 10 sec. The upper limit of the time period for PB is typically 600 sec, and preferably 300 sec. The lower limit of the film thickness of the formed resist film is preferably 10 nm. The upper limit of the film thickness of the formed resist film is preferably 1,000 nm, and more preferably 500 nm.

In order to preclude influences from basic impurities and the like contained in the environmental atmosphere, a protective film disclosed in, for example, Japanese Unexamined Patent Application, Publication No. H5-188598 and the like may be also provided on the resist film. Moreover, in order to prevent the leakage of the acid generator, etc., from the resist film, a protective film for liquid immersion disclosed in, for example, Japanese Unexamined Patent Application, Publication No. 2005-352384 and the like may be also provided on the resist film. It is to be noted that these techniques may be used in combination.

Exposure Step

In this step, the resist film formed in the resist film-forming step is exposed by irradiating the resist film with exposure light through a photomask or the like. Examples of the exposure light include: electromagnetic waves such as visible light rays, ultraviolet rays, far ultraviolet rays, extreme ultraviolet rays (EUV: 13.5 nm), X-rays and γ radiations; charged particle beams or charged particle rays such as electron beams and α-rays; and the like, in accordance with the line width of the intended pattern. Of these, far ultraviolet rays, EUV and electron beams are preferred, an ArF excimer laser beam (wavelength: 193 nm), a KrF excimer laser beam (wavelength: 248 nm), EUV and electron beams are more preferred, and an KrF excimer laser beam, EUV and electron beams are still more preferred.

In a case where the exposure is carried out by liquid immersion lithography, examples of the liquid immersion liquid for use in the exposure include water, fluorine-containing inert liquids, and the like. It is preferred that the liquid immersion liquid is transparent to an exposure wavelength, and has a temperature coefficient of the refractive index as small as possible so that distortion of an optical image projected onto the film is minimized. In particular, when an ArF excimer laser beam (wavelength: 193 nm) is used as an exposure light source, it is preferred to use water in light of availability and ease of handling thereof in addition to the aforementioned considerations. When water is used, a slight amount of an additive which reduces the surface tension of water and imparts enhanced surfactant power may be added. It is preferred that the additive hardly dissolves a resist film on a wafer and has a negligible influence on an optical coating of an inferior face of a lens. The water for use preferably distilled water.

It is preferred that post exposure baking (PEB) is carried out after the exposure to promote dissociation of the acid-labile group included in the polymer (A), etc. mediated by the acid generated from the acid generator (B) upon the exposure in exposed regions of the resist film. This PEB produces a difference in solubility of the resist film in a developer solution between the light-exposed regions and light-unexposed regions. The lower limit of the temperature for PEB is typically 50° C., and preferably 70° C. The upper limit of the temperature for PEB is typically 180° C., and preferably 130° C. The lower limit of the time period for PEB is typically 5 sec, and preferably 10 sec. The upper limit of the time period for PEB is typically 600 sec, and preferably 300 sec.

Development Step

In this step, the resist film exposed in the exposure step is developed with a developer solution, whereby a predetermined resist pattern is formed. The developer solution is exemplified by an alkaline developer solution, a developer solution containing an organic solvent, and the like. The developer solution may be selected depending on the pattern configuration to be formed. A development with an aqueous alkaline solution on the region where a greater intensity of the irradiation is applied when the mask pattern is projected onto the resist film by the exposure, allows light-exposed regions with the intensity of no less than a certain threshold value to be dissolved and removed, thereby enabling the formation of a positive resist pattern. On the other hand, a development with a liquid containing an organic solvent on the region where a less intensity of the irradiation is applied when the mask pattern is projected onto the resist film by the exposure, allows light-exposed regions with the intensity of no greater than a certain threshold value to be dissolved and removed, thereby enabling the formation of a negative resist pattern. In accordance with a resolution and/or pattern configuration desired, these developer solutions may be used in combination to execute the development.

The alkaline developer solution is exemplified by aqueous alkaline solutions prepared by dissolving at least one alkaline compound such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide (TMAH), pyrrole, piperidine, choline, 1,8-diazabicyclo-[5.4.0]-7-undecene, 1,5-diazabicyclo-[4.3.0]-5-nonene, and the like.

The organic solvent which may be contained in the developer solution containing an organic solvent is exemplified by one, or two or more types of the solvents exemplified in connection with the solvent (D) of the abovementioned radiation-sensitive resin composition, and the like. Of these, the ether solvent, the ester solvent and the ketone solvent are preferred. The ether solvent is preferably an aromatic ring-containing ether solvent, and more preferably anisole. The ester solvent is preferably an acetic acid ester solvent, and more preferably n-butyl acetate. The ketone solvent is preferably a chain ketone, and more preferably 2-heptanone.

The lower limit of the content of the organic solvent in the developer solution is preferably 80% by mass, more preferably 90% by mass, still more preferably 95% by mass, and particularly preferably 99% by mass. When the content of the organic solvent in the developer solution falls within the above range, a contrast between the light-exposed regions and light-unexposed regions can be improved, and consequently, a resist pattern having low LWR and superior CDU can be formed while a greater depth of focus and exposure latitude are exhibited. It is to be noted that a component other than the organic solvent is exemplified by water, silicone oil, and the like.

The developer solution may contain, as needed, a surfactant in an appropriate amount. As the surfactant, for example, an ionic/nonionic fluorine and/or silicon surfactant, etc., may be used.

Examples of the development procedure include: a dipping procedure in which the substrate is immersed for a given time period in the developer solution charged in a container; a puddle procedure in which the developer solution is placed to form a dome-shaped bead by way of the surface tension on the surface of the substrate for a given time period to conduct a development; a spraying procedure in which the developer solution is sprayed onto the surface of the substrate; a dynamic dispensing procedure in which the developer solution is continuously applied onto the substrate that is rotated at a constant speed while scanning with a developer solution-application nozzle at a constant speed; and the like.

The development is preferably followed by rinsing with a rinse agent such as water or an alcohol, and then drying. The procedure for rinsing is exemplified by: a procedure in which the rinse agent is continuously applied onto the substrate that is rotated at a constant speed (spin-coating procedure); a procedure in which the substrate is immersed in a bath filled with the rinse agent for a given time period (dip coating procedure), a procedure in which the rinse agent is sprayed on the surface of the substrate (spray coating procedure), and the like.

EXAMPLES

Hereinafter, the present invention will be explained in detail by way of Examples, but the present invention is not in any way limited to these Examples. Measuring methods for various types of physical properties are shown below.

Mw, Mn and Mw/Mn

The Mw and the Mn were determined by gel permeation chromatography (GPC) using GPC columns (available from Tosoh Corporation "G2000 HXL"×2, "G3000 HXL"×1, "G4000 HXL"×1), a differential refractometer as a detector, and mono-dispersed polystyrene as a standard under analytical conditions involving a flow rate of 1.0 mL/min, an elution solvent of tetrahydrofuran, a sample concentration of 1.0% by mass, an amount of injected sample of 100 µL, and a column temperature of 40° C. The dispersity index (Mw/Mn) was calculated based on the results of the determination of the Mw and the Mn.

$^{13}$C-NMR Analysis

An analysis for determining the proportions (mol %) of structural units in each polymer was carried out using a nuclear magnetic resonance apparatus ("JNM-ECX400" available from JEOL, Ltd.) and deuterochloroform as a solvent for measurement.

Synthesis of Compound

Synthesis Example 1: Synthesis of Compound (M-1)

A compound represented by the following formula (M-1) was synthesized according to the following reaction scheme.

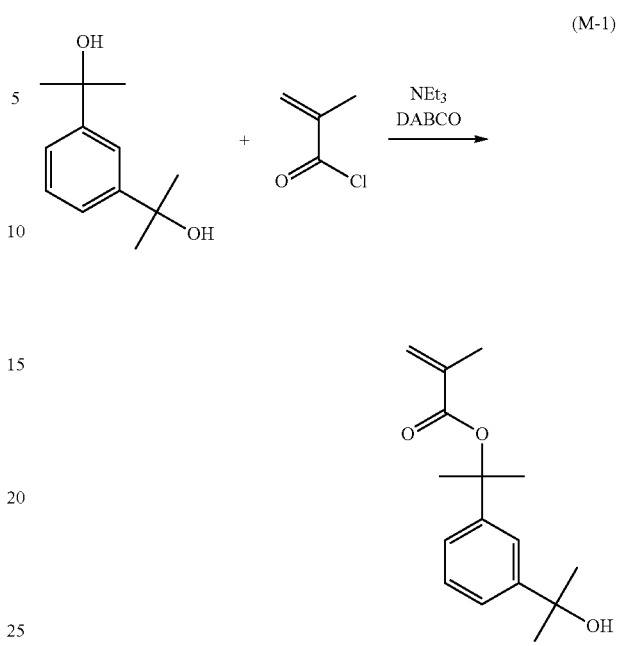

Into a 1,000 mL round-bottom flask were charged 50.0 g (258 mmol) of α,α'-dihydroxy-1,3-diisopropylbenzene, 31.3 g (310 mmol) of triethylamine, 8.72 g (77.4 mmol) of 1,4-diazabicyclo[2.2.2]octane (DABCO) and 300 g of acetonitrile as a solvent, and the mixture was stirred in a nitrogen atmosphere with cooling on an ice bath. To this mixture was slowly added dropwise 27.0 g (258 mmol) of methacryloyl chloride. After the completion of the dropwise addition, the mixture was stirred on an ice bath for 1 hour, and further at room temperature for 18 hrs. Next, water was added to stop the reaction, and then an extraction of the reaction product was carried out with ethyl acetate. Purification by column chromatography was made to give 31.1 g of a compound (M-1) (yield: 46%).

Synthesis Examples 2 to 15: Synthesis of Compounds (M-2) to (M-15)

Compounds represented by the following formulae (M-2) to (M-15) were synthesized by appropriately selecting a precursor and conducting an operation similar manner to that of Synthesis Example 1.

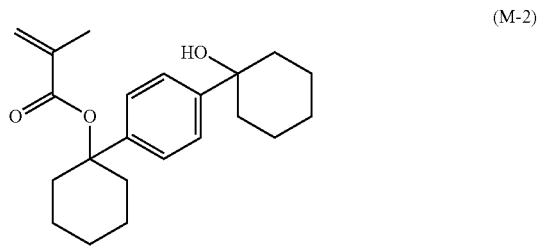

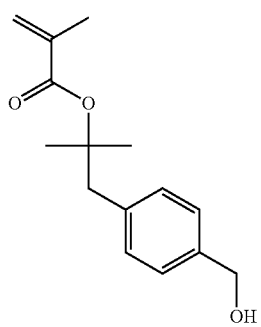 (M-3)
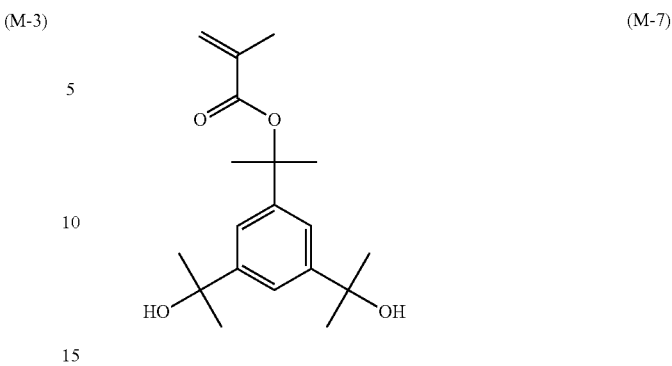 (M-7)
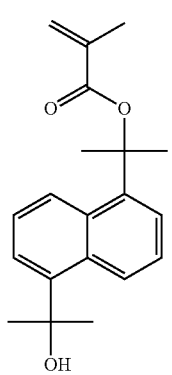 (M-4)
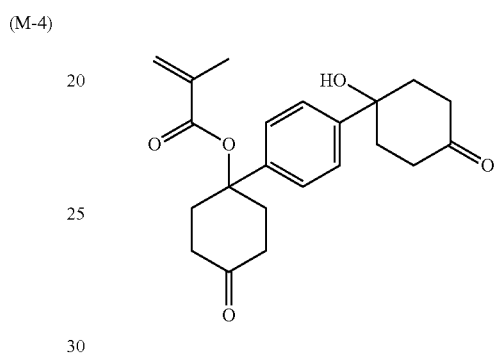 (M-8)
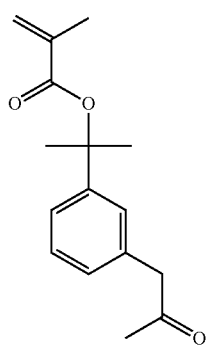 (M-5)
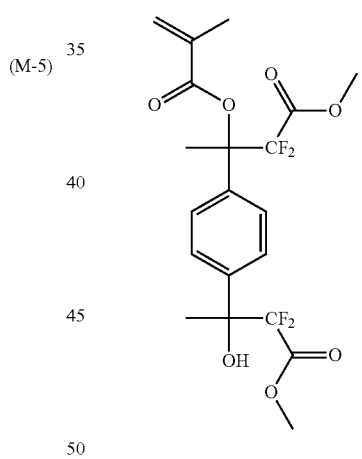 (M-9)
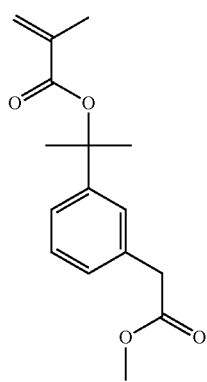 (M-6)
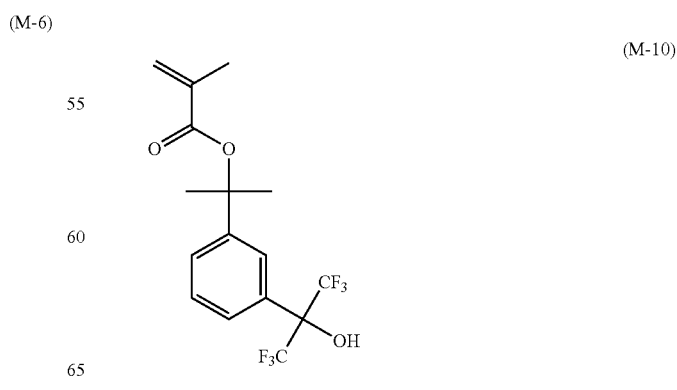 (M-10)

(M-11)
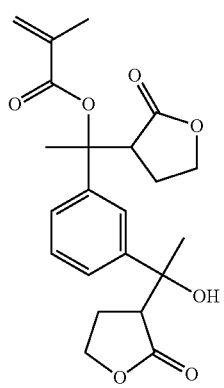
(M-12)
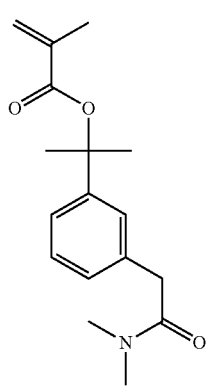
(M-13)
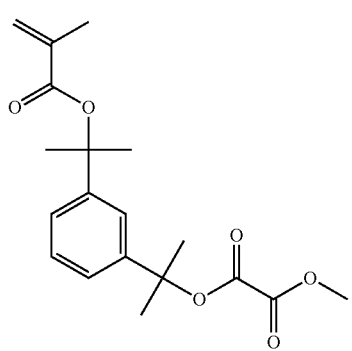
(M-14)
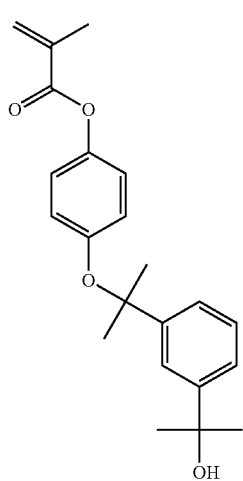
(M-15)
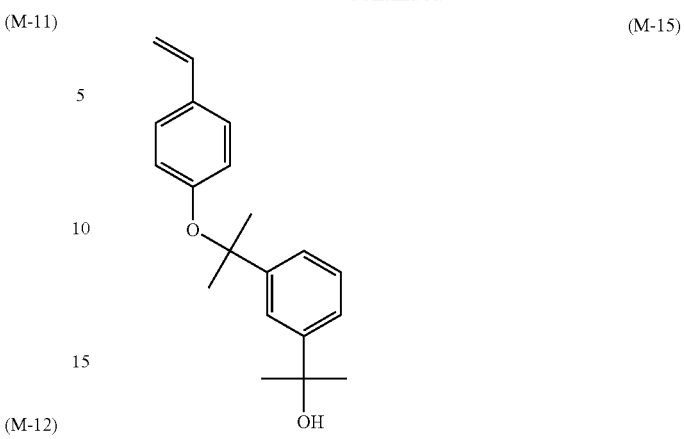
Synthesis of Polymer (A)
Monomers other than the aforementioned compounds (M-1) to (M-15) used in the synthesis of the polymer (A) are shown below.
(M'-1)
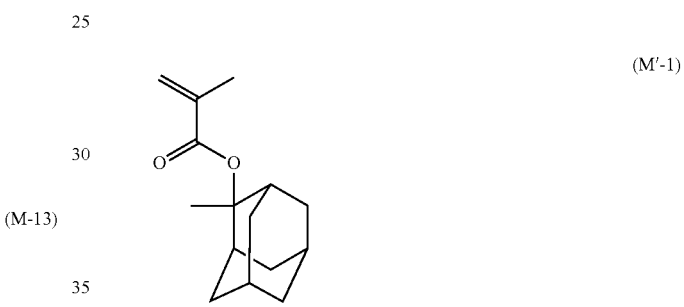
(M'-2)
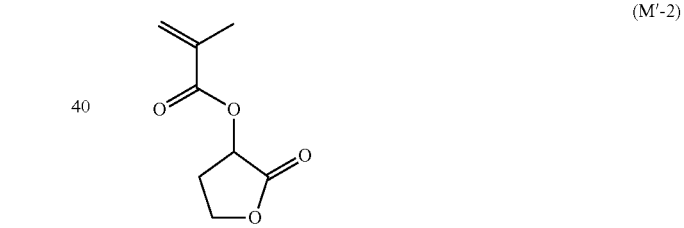
(M'-3)
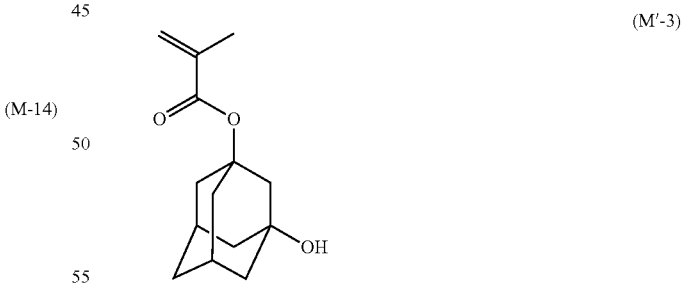
(M'-4)

(M'-5)
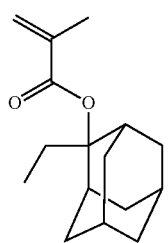
(M'-6)
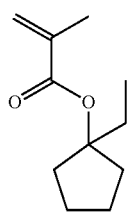
(M'-7)
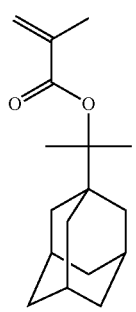
(M'-8)
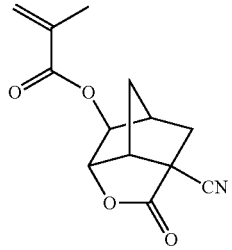
(M'-9)
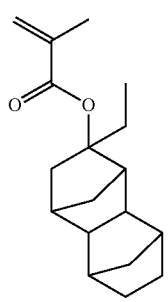
(M'-10)
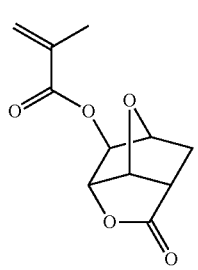
(M'-11)
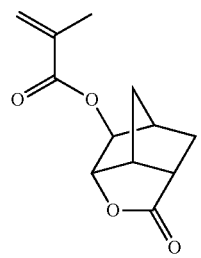
(M'-12)
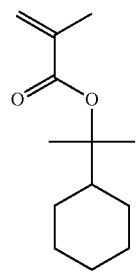
(M'-13)
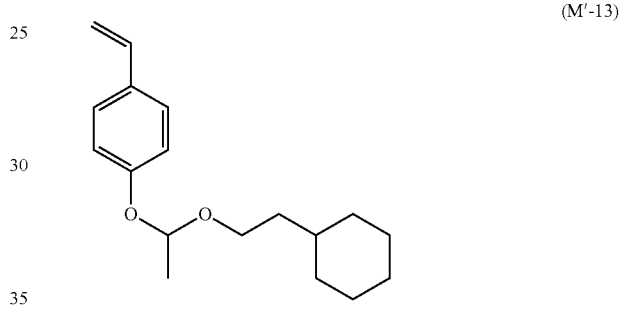
(M'-14)
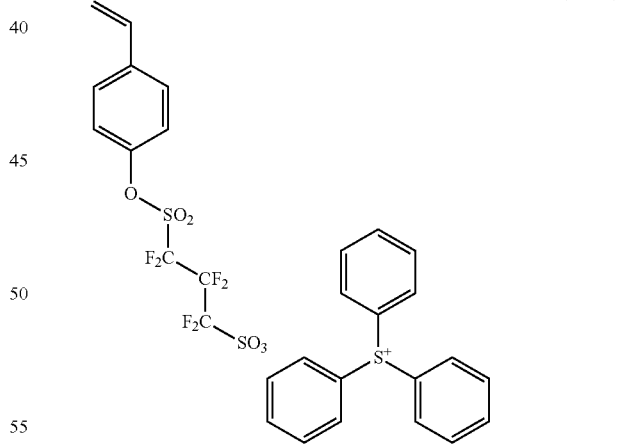
(M'-15)
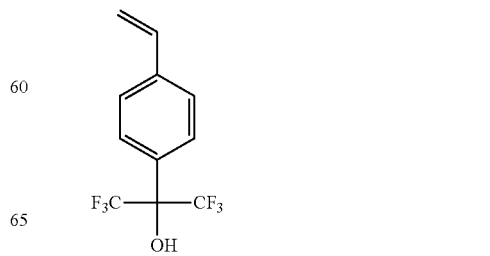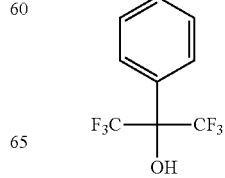

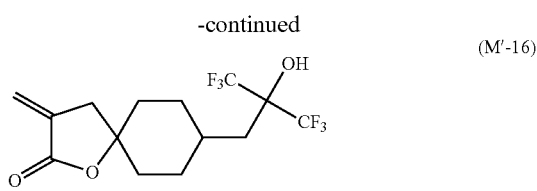

(M'-16)

It is to be noted that: the compounds (M-1) to (M-15) give the structural unit (I); the compounds (M'-1), (M'-5), (M'-6), (M'-7), (M'-9), (M'-12) and (M'-13) give the structural unit (II); the compounds (M'-2), (M'-8), (M'-10) and (M'-11) give the structural unit (III); the compound (M'-3) gives the structural unit (IV); the compound (M'-4) give the structural unit (V); and the compounds (M'-15) and (M'-16) give the structural unit (VI). The compound (M'-14) serves in incorporating the structural unit of the acid generator (B) into the polymer (A).

Synthesis Example 16: Synthesis of Polymer (A-1)

A monomer solution was prepared by dissolving 6.60 g (30 mol %) of the compound (M'-1), 6.39 g (40 mol %) of the compound (M'-2), 3.33 g (15 mol %) of the compound (M'-3) and 3.69 g (15 mol %) of the compound (M-1) in 40 g of 2-butanone, and further adding thereto 0.77 g (5 mol % with respect to the total number of moles of the compounds) of AIBN as a radical polymerization initiator. Next, a 100 mL three-neck flask containing 20 g of 2-butanone was purged with nitrogen for 30 min, then heated to 80° C. with stirring, and the monomer solution prepared as described above was added dropwise over 3 hrs using a dropping funnel. The time of the start of the dropwise addition was regarded as the time of the start of the polymerization reaction, and the polymerization reaction was allowed to proceed for 6 hrs. After the completion of the polymerization reaction, the polymerization reaction mixture was water-cooled to 30° C. or below. The cooled polymerization reaction mixture was poured into 400 g of methanol, and a precipitated white powder was filtered off. The collected white powder was washed twice with 80 g of methanol, followed by separation by filtration, and dried at 50° C. for 17 hrs to obtain a polymer (A-1) as a white powder (product amount: 15.2 g, yield: 76%). The polymer (A-1) had an Mw of 7,300 and an Mw/Mn of 1.53. In addition, the result of $^{13}$C-NMR analysis indicated that the proportions of the structural units derived from (M'-1), (M'-2), (M'-3) and (M-1) were 30.1 mol %, 40.2 mol %, 14.6 mol % and 15.1 mol %, respectively.

Synthesis Example 17: Synthesis of Polymer (A-2)

After 45.16 g (60 mol %) of the compound (M'-4), 23.05 g (20 mol %) of the compound (M'-5) and 31.79 g (20 mol %) of the compound (M-2), 3.81 g (5 mol % with respect to the total number of moles of the monomers) of AIBN as a radical polymerization initiator, as well as 1.14 g (1.5 mol % with respect to the total number of moles of the monomers) of t-dodecyl mercaptan as a chain transfer agent were dissolved in 100 g of propylene glycol monomethyl ether, the polymerization was allowed to proceed for 16 hours in a nitrogen atmosphere, while maintaining the reaction temperature of 70° C. After completing the polymerization reaction, the polymerization reaction mixture was added dropwise into 1,000 g of n-hexane to allow a polymer to be solidified and purified. Next, 150 g of propylene glycol monomethyl ether was added to the polymer and then 150 g of methanol, 34 g of triethylamine and 6 g of water were further added thereto, and the hydrolysis reaction was allowed to proceed for 8 hours while the mixture was refluxed at the boiling point thereof. After the completion of the reaction, the solvent and triethylamine were distilled under vacuum. The obtained polymer was dissolved in 150 g of acetone, and then added dropwise into 2,000 g of water to permit solidification. The formed white powder was filtered off and dried at 50° C. for 17 hours to obtain a polymer (A-2) as a white powder (product amount: 65.7 g; yield: 77%). The polymer (A-2) had an Mw of 7,500 and an Mw/Mn of 1.90. In addition, the result of $^{13}$C-NMR analysis indicated that the proportions of the structural units derived from p-hydroxystyrene, (M'-5) and (M-2) were 60.4 mol %, 19.8 mol % and 19.8 mol %, respectively.

Synthesis Examples 18 to 31: Synthesis of Polymers (A-3) to (A-15) and (CA-1)

Polymers (A-3) to (A-15) and (CA-1) were synthesized by a similar operation to that of Synthesis Example 16 or Synthesis Example 17 except that the type and the amount of the monomers used were as shown in Table 1 below. The symbol "-" in Table 1 indicates that the corresponding monomer was not used. The proportion of each structural unit contained (mol %), the yield (%), the Mw and the Mw/Mn of the obtained polymer are shown together in Table 1.

TABLE 1

| | | Monomer that gives structural unit (I) | | Monomer that gives structural unit (II) | | | Monomer that gives structural units (III) to (VI) | | | | |
|---|---|---|---|---|---|---|---|---|---|---|---|
| | (A) Polymer | type | amount (mol %) | proportion of structural unit (mol %) | type | amount (mol %) | proportion of structural unit (mol %) | type | amount (mol %) | proportion of structural unit (mol %) | Yield (%) | Mw | Mw/Mn |
| Synthesis Example 16 | A-1 | M-1 | 15 | 15.1 | M'-1 | 30 | 30.1 | M'-2 | 40 | 40.2 | 76 | 7,300 | 1.53 |
| | | | | | | | | M'-3 | 15 | 14.6 | | | |
| Synthesis Example 17 | A-2 | M-2 | 20 | 19.8 | M'-5 | 20 | 19.8 | M'-4 | 60 | 60.4 | 77 | 7,500 | 1.90 |
| Synthesis Example 18 | A-3 | M-3 | 10 | 10.2 | M'-6 | 30 | 29.9 | M'-8 | 50 | 49.8 | 75 | 7,400 | 1.54 |
| | | | | | M'-7 | 10 | 10.1 | | | | | | |
| Synthesis Example 19 | A-4 | M-4 | 15 | 14.9 | M'-6 | 10 | 10.1 | M'-10 | 40 | 39.8 | 76 | 7,400 | 1.53 |
| | | | | | M'-9 | 10 | 10.1 | M'-3 | 25 | 25.1 | | | |
| Synthesis Example 20 | A-5 | M-5 | 30 | 29.9 | M'-13 | 20 | 19.9 | M'-8 | 50 | 50.2 | 77 | 7,500 | 1.54 |
| Synthesis Example 21 | A-6 | M-6 | 20 | 20.1 | M'-6 | 20 | 19.8 | M'-10 | 55 | 55.1 | 76 | 7,600 | 1.53 |
| | | | | | | | | M'-14 | 5 | 5.0 | | | |

TABLE 1-continued

| (A) Polymer | Monomer that gives structural unit (I) | | | Monomer that gives structural unit (II) | | | Monomer that gives structural units (III) to (VI) | | | Yield (%) | Mw | Mw/Mn |
|---|---|---|---|---|---|---|---|---|---|---|---|---|
| | type | amount (mol %) | proportion of structural unit (mol %) | type | amount (mol %) | proportion of structural unit (mol %) | type | amount (mol %) | proportion of structural unit (mol %) | | | |
| Synthesis Example 22 | A-7 | M-7 | 30 | 29.9 | M'-6 | 30 | 29.9 | M'-15 | 40 | 40.2 | 75 | 7,400 | 1.88 |
| Synthesis Example 23 | A-8 | M-8 | 30 | 30.1 | M'-5 | 20 | 20.1 | M'-4 | 30 | 29.9 | 76 | 7,800 | 1.76 |
| | | | | | | | | M'-16 | 20 | 19.9 | | | |
| Synthesis Example 24 | A-9 | M-9 | 30 | 29.9 | M'-12 | 30 | 30.2 | M'-11 | 40 | 39.9 | 75 | 7,400 | 1.52 |
| Synthesis Example 25 | A-10 | M-10 | 10 | 10.2 | M'-6 | 30 | 29.9 | M'-8 | 50 | 49.9 | 76 | 7,400 | 1.53 |
| | | | | | M'-7 | 10 | 10.0 | | | | | | |
| Synthesis Example 26 | A-11 | M-11 | 10 | 9.8 | M'-6 | 30 | 30.1 | M'-8 | 50 | 50.2 | 75 | 7,300 | 1.53 |
| | | | | | M'-7 | 10 | 9.9 | | | | | | |
| Synthesis Example 27 | A-12 | M-12 | 15 | 15.1 | M'-6 | 25 | 24.9 | M'-10 | 55 | 55.1 | 76 | 7,300 | 1.54 |
| | | | | | | | | M'-14 | 5 | 4.9 | | | |
| Synthesis Example 28 | A-13 | M-13 | 5 | 4.9 | M'-6 | 25 | 25.1 | M'-10 | 55 | 55.1 | 77 | 7,400 | 1.53 |
| | | M-1 | 10 | 9.9 | | | | M'-14 | 5 | 5.0 | | | |
| Synthesis Example 29 | A-14 | M-14 | 10 | 10.2 | M'-6 | 30 | 29.9 | M'-8 | 50 | 49.9 | 72 | 7,300 | 1.54 |
| | | | | | M'-7 | 10 | 10.0 | | | | | | |
| Synthesis Example 30 | A-15 | M-15 | 10 | 10.2 | M'-6 | 30 | 29.9 | M'-8 | 50 | 49.9 | 74 | 7,400 | 1.52 |
| | | | | | M'-7 | 10 | 10.0 | | | | | | |
| Synthesis Example 31 | CA-1 | — | — | — | M'-1 | 35 | 34.8 | M'-2 | 45 | 45.1 | 76 | 7,500 | 1.52 |
| | | | | | | | | M'-3 | 20 | 20.1 | | | |

Preparation of Radiation-Sensitive Resin Composition

Components other than the polymer (A) used in the preparation of the radiation-sensitive resin composition are shown below.

(B) Acid Generating Agent

Each structure formula is shown below.

B-1: triphenylsulfonium 2-(adamantan-1-ylcarbonyloxy)-1,1,3,3,3-pentafluoropropane-1-sulfonate B-2: triphenylsulfonium norbornanesultone-2-yloxycarbonyl difluoromethanesulfonate B-3: triphenylsulfonium 3-(piperidin-1-ylsulfonyl)-1,1,2,2,3,3-hexafluoropropane-1-sulfonate B-4: triphenylsulfonium adamantan-1-yloxycarbonyl difluoromethanesulfonate

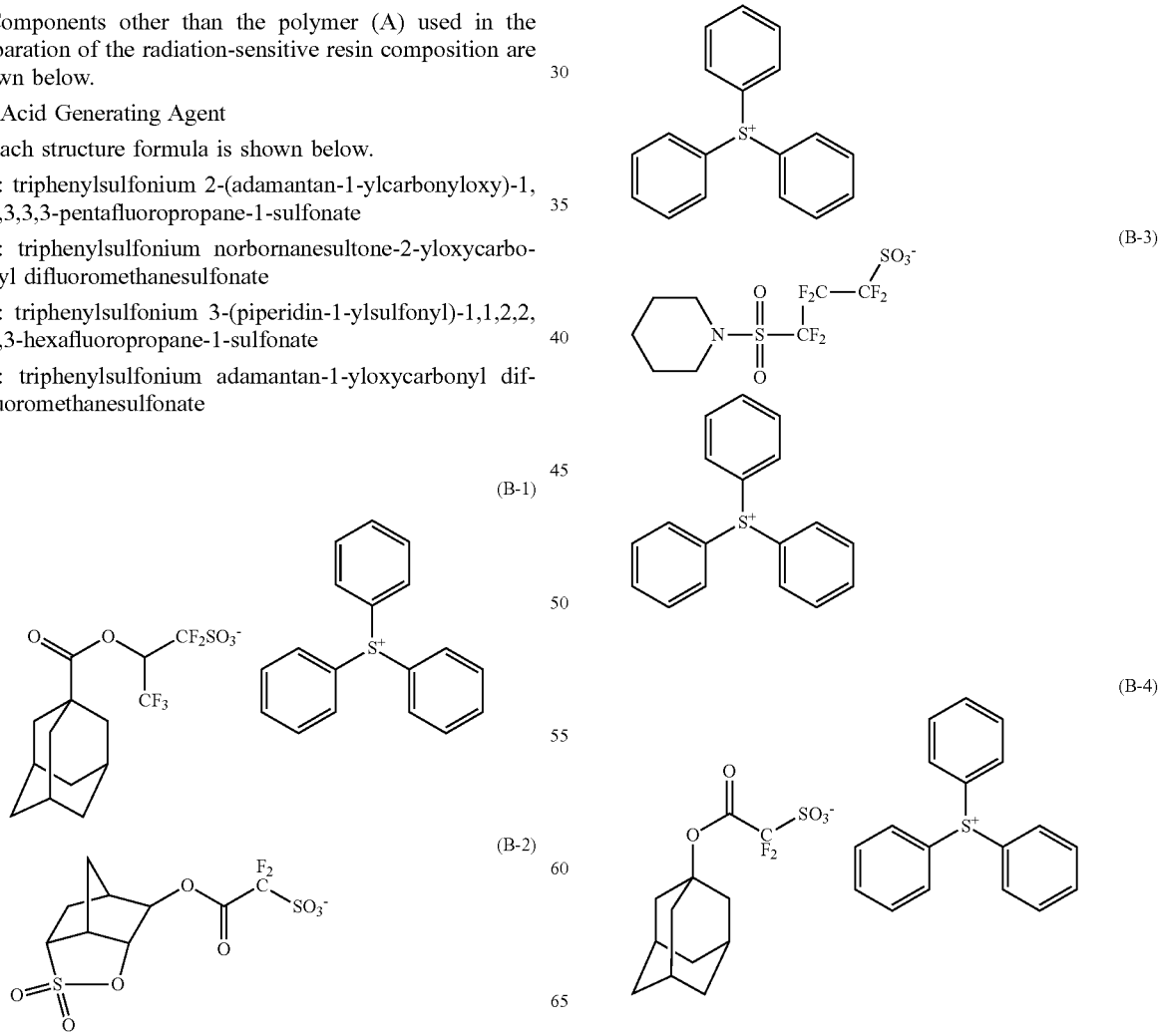

(C) Acid Diffusion Control Agent
Each structure formula is shown below.
C-1: triphenylsulfonium salicylate
C-2: triphenylsulfonium 10-camphorsulfonate
C-3: N-(undecan-1-ylcarbonyloxyethyl)morpholine
C-4: 2,6-di-i-propylaniline
C-5: tri-n-pentylamine

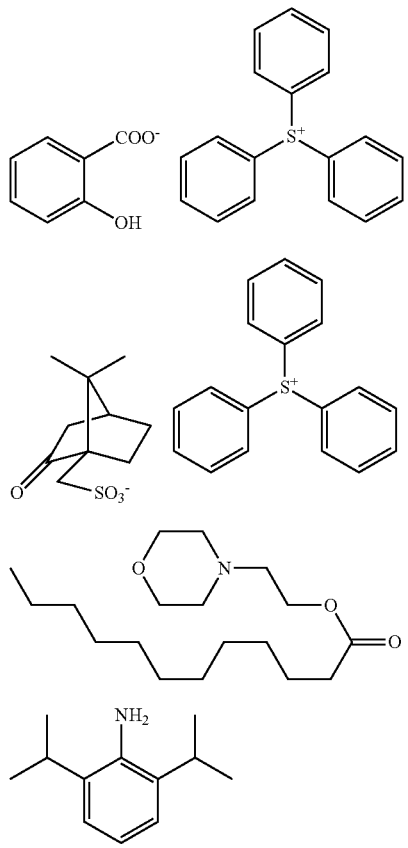
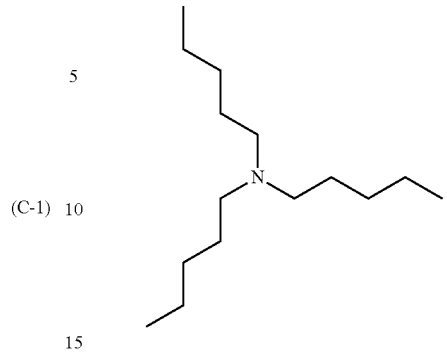

(D) Solvent
D-1: propylene glycol monomethyl ether acetate
D-2: cyclohexanone

Example 1

A radiation-sensitive resin composition (J-1) was prepared by mixing 100 parts by mass of (A-1) as the polymer (A), 20 parts by mass of (B-1) as the acid generating agent (B), 3.6 parts by mass of (C-1) as the acid diffusion control agent (C), and as the solvent (D) 4,280 parts by mass of (D-1) and 1,830 parts by mass of (D-2), followed by filtration of the resulting mixture through a membrane filter having a pore size of 20 nm.

Examples 2 to 16 and Comparative Example 1

Radiation-sensitive resin compositions (J-2) to (J-16) and (CJ-1) were prepared by a similar operation to that of Example 1 except that the type and the content of each component used were as shown in Table 2 below. The symbol "-" in Table 2 indicates that the polymer (A) used had the structure of the acid generating agent (B) incorporated therein. It is to be noted that the polymers (A-6), (A-12) and (A-13) had the structural unit corresponding to the acid generator (B).

TABLE 2

| | Radiation-sensitive resin composition | (A) Polymer type | content (parts by mass) | (B) Acid generating agent type | content (parts by mass) | (C) Acid diffusion control agent type | content (parts by mass) | (D) Solvent type | content (parts by mass) |
|---|---|---|---|---|---|---|---|---|---|
| Example 1 | J-1 | A-1 | 100 | B-1 | 20 | C-1 | 3.6 | D-1/D-2 | 4,280/1,830 |
| Example 2 | J-2 | A-2 | 100 | B-2 | 20 | C-2 | 3.6 | D-1/D-2 | 4,280/1,830 |
| Example 3 | J-3 | A-3 | 100 | B-3 | 20 | C-3 | 3.6 | D-1/D-2 | 4,280/1,830 |
| Example 4 | J-4 | A-4 | 100 | B-4 | 20 | C-4 | 3.6 | D-1/D-2 | 4,280/1,830 |
| Example 5 | J-5 | A-5 | 100 | B-1 | 20 | C-5 | 3.6 | D-1/D-2 | 4,280/1,830 |
| Example 6 | J-6 | A-6 | 100 | — | — | C-1 | 3.6 | D-1/D-2 | 4,280/1,830 |
| Example 7 | J-7 | A-7 | 100 | B-2 | 20 | C-2 | 3.6 | D-1/D-2 | 4,280/1,830 |
| Example 8 | J-8 | A-8 | 100 | B-3 | 20 | C-3 | 3.6 | D-1/D-2 | 4,280/1,830 |
| Example 9 | J-9 | A-9 | 100 | B-4 | 20 | C-4 | 3.6 | D-1/D-2 | 4,280/1,830 |
| Example 10 | J-10 | A-10 | 100 | B-1 | 20 | C-5 | 3.6 | D-1/D-2 | 4,280/1,830 |
| Example 11 | J-11 | A-11 | 100 | B-2 | 20 | C-1 | 3.6 | D-1/D-2 | 4,280/1,830 |
| Example 12 | J-12 | A-12 | 100 | B-1 | 5 | C-2 | 3.6 | D-1/D-2 | 4,280/1,830 |
| Example 13 | J-13 | A-13 | 100 | — | — | C-3 | 3.6 | D-1/D-2 | 4,280/1,830 |
| Example 14 | J-14 | A-1 | 60 | B-1 | 12 | C-1 | 3.6 | D-1/D-2 | 4,280/1,830 |
| | | A-2 | 40 | B-2 | 8 | | | | |

TABLE 2-continued

|  | Radiation-sensitive resin composition | (A) Polymer type | (A) Polymer content (parts by mass) | (B) Acid generating agent type | (B) Acid generating agent content (parts by mass) | (C) Acid diffusion control agent type | (C) Acid diffusion control agent content (parts by mass) | (D) Solvent type | (D) Solvent content (parts by mass) |
|---|---|---|---|---|---|---|---|---|---|
| Example 15 | J-15 | A-14 | 100 | B-3 | 20 | C-4 | 3.6 | D-1/D-2 | 4,280/1,830 |
| Example 16 | J-16 | A-15 | 100 | B-4 | 20 | C-5 | 3.6 | D-1/D-2 | 4,280/1,830 |
| Comparative Example 1 | CJ-1 | CA-1 | 100 | B-1 | 20 | C-1 | 3.6 | D-1/D-2 | 4,280/1,830 |

Formation of Resist Pattern (Development with Alkali)

The radiation-sensitive resin composition prepared as described above was applied on the surface of an 8-inch silicon wafer using a spin-coater ("CLEAN TRACK ACT8" available from Tokyo Electron Limited), and subjected to PB at 90° C. for 60 sec. Cooling was then carried out at 23° C. for 30 sec to form a resist film having a film thickness of 50 nm. Next, this resist film was irradiated with an electron beam using a simplified electron beam writer ("HL800D" available from Hitachi, Ltd.; output: 50 KeV, electric current density: 5.0 A/cm$^2$). After the irradiation, PEB was carried out at 120° C. for 60 sec. Thereafter, a development was carried out using a 2.38% by mass aqueous TMAH solution as an alkaline developer solution at 23° C. for 30 sec, followed by washing with water and drying to form a positive resist pattern.

Formation of Resist Pattern (Development with Organic Solvent)

A negative resist pattern was formed by a similar operation to that of the Formation of Resist Pattern (Development with Alkali) described above except that: n-butyl acetate as an developer solution containing an organic solvent was used in place of the aqueous TMAH solution used in the Formation of Resist Pattern (Development with Alkali) described above to execute a development; and washing with water was not carried out.

Evaluations

Determinations were carried out as in the following on the resist patterns formed as described above to evaluate the radiation-sensitive resin compositions in terms of an LWR performance, a CDU performance, a resolution, rectangularity of cross-sectional shape, a depth of focus and exposure latitude. The results of the evaluations are shown in Table 3. For a line-width measurement of the resist patterns, a scanning electron microscope ("S-9380" available from Hitachi High-Technologies Corporation) was used. It is to be noted that an exposure dose at which a line width of 40 nm (L/S=1/1) was formed in the formation of the resist pattern described above was defined as "optimum exposure dose".

LWR Performance

The resist pattern formed as described above was observed from above the pattern using the scanning electron microscope. The line width was measured at arbitrary points of 50 in total, then a 3 Sigma value was determined from the distribution of the measurements, and the value was designated as "LWR performance (nm)". The smaller value of the "LWR performance (nm)" indicates less variance of the line width, revealing that the LWR performance is favorable. The LWR performance may be evaluated to be: "favorable" when the value was no greater than 6 nm; and "unfavorable" when the value was greater than 6 nm.

CDU Performance

The resist pattern formed as described above was observed from above the pattern using the scanning electron microscope. The line width was measured at 20 points within the range of 400 nm, and an averaged value of the width was determined. The averaged value was determined at arbitrary points of 500 in total, and a 3 Sigma value was determined from the distribution of the averaged values. The 3 Sigma value was defined as "CDU performance (nm)". The smaller value of the "CDU performance (nm)" indicates a less variance of the line widths even in cases of sparse patterns, revealing that the CDU performance is favorable. The CDU performance may be evaluated to be: "favorable" when the value was no greater than 3.5 nm; and "unfavorable" when the value was greater than 3.5 nm.

Resolution

A dimension of the minimum resist pattern which was resolved at the optimum exposure dose was measured, and the measurement value was defined as "resolution (nm)". The smaller value of the "resolution (nm)" indicates that a finer pattern can be formed, revealing that the resolution is favorable. The resolution may be evaluated to be: "favorable" when the value was no greater than 35 nm; and "unfavorable" when the value was greater than 35 nm.

Rectangularity of Cross-Sectional Shape

The cross-sectional shape of the resist pattern which was resolved at the optimum exposure dose was observed, and a line width Lb in the middle portion of the resist pattern along the height direction, and a line width La on the top of the resist pattern were measured. The value La/Lb was calculated, and this value was decided as an indicative of the rectangularity of cross-sectional shape. The rectangularity of cross-sectional shape may be evaluated to be: "favorable" in a case where $0.9 \leq (La/Lb) \leq 1.1$; and "unfavorable" in a case where $(La/Lb) \leq 0.9$ or $1.1 \leq (La/Lb)$.

Depth of Focus

On the resist pattern which was resolved at the optimum exposure dose, the dimension of a pattern formed when the focus was shifted along the depth direction was measured, and a latitude in the depth direction in which the pattern dimension falls within the range of 90% to 110% of the basis without being accompanied by a bridge and/or residue was determined. The measurement value was defined as "depth of focus (nm)". The greater depth of focus indicates better latitude of the focal point, revealing that the depth of focus is favorable. The depth of focus may be evaluated to be: "favorable" when the value was no less than 50 nm; and "unfavorable" when the value was less than 50 nm.

Exposure Latitude

An exposure dose was varied in step of 1 μC/cm$^2$ within an exposure dose range including the optimum exposure dose, and a resist pattern was formed at each exposure dose. The line width of each resist pattern was measured using the scanning electron microscope. The exposure dose E (44) at which the line width of 44 nm was attained and the exposure dose E (36) at which the line width of 36 nm was attained were determined from the relationship between the line width obtained and the exposure dose, and the exposure latitude (%) was calculated using the following equation: exposure latitude=[E(36)–E(44)]×100/(optimum exposure dose). The greater "exposure latitude" value indicates a less variation of the dimension of the formed pattern with a variation of the exposure dose, leading to a higher process yield in the production of devices. The exposure latitude may be evaluated to be: "favorable" when the value was no less than 20%; and "unfavorable" when the value was less than 20%.

TABLE 3

| | | Development with alkali | | | | | Development with organic solvent | | | | | |
|---|---|---|---|---|---|---|---|---|---|---|---|---|
| | Radiation-sensitive resin composition | LWR performance (nm) | CDU performance (nm) | resolution (nm) | rectangularity of cross-sectional shape | depth of focus (nm) | exposure latitude (%) | LWR performance (nm) | CDU performance (nm) | resolution (nm) | rectangularity of cross-sectional shape | depth of focus (nm) | exposure latitude (%) |
| Example 1 | J-1 | 5.34 | 3.32 | 33 | 0.95 | 60 | 22.2 | 5.54 | 3.44 | 32 | 1.02 | 80 | 21.9 |
| Example 2 | J-2 | 5.21 | 3.22 | 32 | 0.93 | 60 | 23.4 | 5.41 | 3.34 | 33 | 1.01 | 70 | 23.1 |
| Example 3 | J-3 | 5.01 | 3.21 | 33 | 0.92 | 70 | 21.5 | 5.21 | 3.33 | 34 | 1.03 | 80 | 21.2 |
| Example 4 | J-4 | 4.89 | 3.06 | 33 | 0.91 | 80 | 22.6 | 5.09 | 3.18 | 34 | 1.09 | 90 | 22.3 |
| Example 5 | J-5 | 4.99 | 3.01 | 32 | 0.98 | 80 | 22.3 | 5.19 | 3.13 | 34 | 1.08 | 80 | 22.0 |
| Example 6 | J-6 | 5.32 | 3.02 | 34 | 0.99 | 90 | 21.6 | 5.52 | 3.14 | 33 | 1.04 | 80 | 21.3 |
| Example 7 | J-7 | 4.87 | 3.03 | 33 | 0.95 | 60 | 21.8 | 5.07 | 3.15 | 32 | 1.03 | 70 | 21.5 |
| Example 8 | J-8 | 4.67 | 3.24 | 33 | 0.93 | 70 | 22.9 | 4.87 | 3.36 | 33 | 1.01 | 60 | 22.6 |
| Example 9 | J-9 | 5.21 | 3.22 | 32 | 0.92 | 70 | 22.7 | 5.41 | 3.34 | 33 | 1.03 | 80 | 22.4 |
| Example 10 | J-10 | 5.14 | 3.21 | 32 | 0.91 | 80 | 21.5 | 5.34 | 3.33 | 33 | 1.04 | 70 | 21.2 |
| Example 11 | J-11 | 5.03 | 3.25 | 32 | 0.91 | 90 | 21.7 | 5.23 | 3.37 | 34 | 1.05 | 70 | 21.4 |
| Example 12 | J-12 | 5.09 | 3.06 | 33 | 0.93 | 80 | 22.7 | 5.29 | 3.18 | 32 | 1.06 | 80 | 22.4 |
| Example 13 | J-13 | 4.99 | 3.08 | 32 | 0.93 | 70 | 22.6 | 5.19 | 3.20 | 33 | 1.04 | 90 | 22.3 |
| Example 14 | J-14 | 4.84 | 3.09 | 33 | 0.92 | 80 | 21.6 | 5.04 | 3.21 | 32 | 1.03 | 70 | 21.3 |
| Example 15 | J-15 | 4.78 | 3.29 | 32 | 0.95 | 70 | 22.1 | 4.99 | 3.31 | 33 | 1.02 | 80 | 21.8 |
| Example 16 | J-16 | 4.69 | 3.28 | 33 | 0.93 | 70 | 21.9 | 5.02 | 3.28 | 33 | 1.03 | 70 | 22.2 |
| Comparative Example 1 | CJ-1 | 8.81 | 3.89 | 38 | 0.86 | 20 | 16.3 | 9.01 | 4.01 | 38 | 1.19 | 20 | 15.8 |

From the results shown in Table 3, the radiation-sensitive resin compositions of Examples were proven to be superior in the LWR performance, CDU performance, resolution, rectangularity of cross-sectional shape, depth of focus and exposure latitude in both cases of the development with an alkali and the development with an organic solvent. On the other hand, the radiation-sensitive resin compositions of Comparative Examples were proven to be inferior in all terms of the performances as compared with Examples. It is to be noted that an exposure to electron beam is generally known to give a tendency similar to that in the case of the exposure to EUV. Therefore, the radiation-sensitive resin compositions of Examples are expected to be superior in the LWR performance, etc., also in the case of an exposure to EUV.

The radiation-sensitive resin composition and the resist pattern-forming method according to the embodiments of the present invention enable a resist pattern having low LWR and superior CDU, a high resolution, and superior rectangularity of cross-sectional shape to be formed while a great depth of focus and exposure latitude are exhibited. Therefore, these can be suitably used for manufacture of semiconductor devices in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

The invention claimed is:

1. A radiation-sensitive resin composition comprising:
a polymer comprising a structural unit comprising: an acid-labile group; and an oxoacid group or phenolic hydroxyl group protected by the acid-labile group,
wherein the acid-labile group protects the oxoacid group or phenolic hydroxyl group by being substituted for a hydrogen atom and bonding to an oxy group in the oxoacid group or phenolic hydroxyl group, and is capable of being dissociated from the oxy group by an acid, and
wherein the acid-labile group is represented by formula (1):

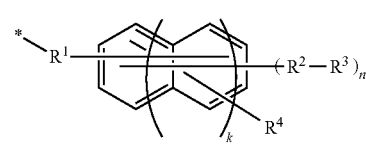

(1)

wherein, in the formula (1),
$R^1$ and $R^2$ each independently represent a divalent organic group having 1 to 20 carbon atoms;
$R^3$ represents a monovalent group having 1 to 40 atoms and comprising an oxygen atom, a sulfur atom, a nitrogen atom, or a combination thereof;
k is an integer of 0 to 4;
n is an integer of 1 to 13;
$R^4$ represents a halogen atom, a monovalent hydrocarbon group having 1 to 10 carbon atoms, or an alkoxy group having 1 to 10 carbon atoms;
m is an integer of 0 to 12,
wherein a sum of m and n is no greater than 13,
in a case where n is no less than 2, a plurality of $R^2$s are identical or different, and a plurality of $R^3$s are identical or different, and
in a case where m is no less than 2, a plurality of $R^4$s are identical or different; and

* denotes a binding site to the oxy group in the oxoacid group or phenolic hydroxyl group protected; and
a radiation-sensitive acid generator.

2. The radiation-sensitive resin composition according to claim 1, wherein the divalent organic group represented by $R^1$ in the formula (1) is represented by any one of formulae (a-1) to (a-3):

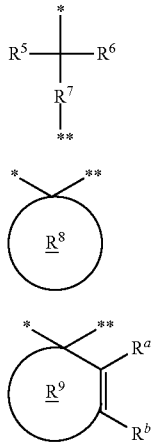

wherein,
in the formulae (a-1) to (a-3),
* denotes a binding site to the oxy group in the oxoacid group or phenolic hydroxyl group protected; and
** denotes a site bound to the aromatic ring in the formula (1), in the formula (a-1),
$R^5$ and $R^6$ each independently represent a monovalent chain hydrocarbon group having 1 to 10 carbon atoms, a monovalent alicyclic hydrocarbon group having 3 to 10 carbon atoms, a group having —COO— between two adjacent carbon atoms in the chain hydrocarbon group or the alicyclic hydrocarbon group, or a group obtained by substituting a part of hydrogen atoms included in the chain hydrocarbon group or the alicyclic hydrocarbon group with a fluorine atom or a hydroxy group; and
$R^7$ represents a single bond or a divalent hydrocarbon group having 1 to 18 carbon atoms,
in the formula (a-2),
$R^8$ represents a substituted or unsubstituted divalent alicyclic hydrocarbon group having 3 to 20 carbon atoms, and
in the formula (a-3),
$R^9$ represents a substituted or unsubstituted tetravalent alicyclic hydrocarbon group having 5 to 20 ring atoms and having a double bond; and
$R^a$ and $R^b$ each independently represent a hydrogen atom or a monovalent hydrocarbon group having 1 to 10 carbon atoms.

3. The radiation-sensitive resin composition according to claim 1, wherein in the formula (1),
the monovalent group represented by $R^3$ is —OH, —COR, —COOR, —OCOCOOR, or —CONR$_2$; and
R represents a hydrogen atom or a monovalent hydrocarbon group having 1 to 10 carbon atoms.

4. The radiation-sensitive resin composition according to claim 1, wherein in the formula (1), the divalent organic group represented by $R^2$ is a substituted or unsubstituted alkanylidene group or a substituted or unsubstituted cycloalkanylidene group.

5. The radiation-sensitive resin composition according to claim 1, wherein the structural unit is represented by any one of formulae (1-1) to (1-3):

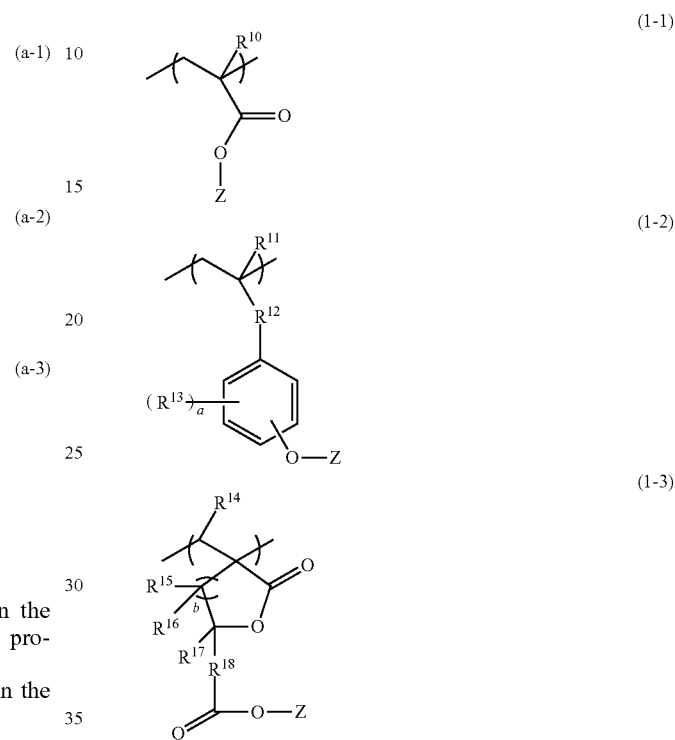

wherein, in the formulae (1-1) to (1-3),
Z represents the acid-labile group represented by the formula (1), in the formula (1-1),
$R^{10}$ represents a hydrogen atom, a fluorine atom, a methyl group, or a trifluoromethyl group,
in the formula (1-2),
$R^{11}$ represents a hydrogen atom or a methyl group;
$R^{12}$ represents a single bond, —O—, —COO—, or —CONH—;
$R^{13}$ represents a monovalent organic group having 1 to 10 carbon atoms; and
a is an integer of 0 to 4, wherein
in a case where a is no less than 2, a plurality of $R^1$'s are identical or different,
in the formula (1-3),
$R^{14}$ represents a hydrogen atom or a methyl group;
$R^{15}$, $R^{16}$ and $R^{17}$ each independently represent a hydrogen atom, a halogen atom, a hydroxy group or a monovalent organic group having 1 to 20 carbon atoms, or at least two of one or more $R^{15}$(s), one or more $R^{16}$(s) and $R^{17}$ optionally taken together represent a ring structure having 3 to 20 ring atoms together with the carbon atom to which the at least two bond;
b is an integer of 1 to 4,
wherein in a case where b is no less than 2, a plurality of $R^{15}$s are identical or different, and a plurality of $R^{16}$s are identical or different;
$R^{18}$ represents a single bond or a divalent organic group having 1 to 20 carbon atoms, or $R^{17}$ and $R^{18}$ optionally taken together represent a ring structure having 3 to 20 ring atoms together with the carbon atom to which $R^{17}$ and $R^{18}$ bond.

6. The radiation-sensitive resin composition according to claim 1, wherein an amount of the structural unit with respect to total structural units in the polymer is 1 mol % or more and 70 mol % or less.

7. The radiation-sensitive resin composition according to claim 1, wherein an amount of the structural unit with respect to total structural units in the polymer is 5 mol % or more and 50 mol % or less.

8. The radiation-sensitive resin composition according to claim 1, wherein an amount of the structural unit with respect to total structural units in the polymer is 8 mol % or more and 35 mol % or less.

9. The radiation-sensitive resin composition according to claim 1, wherein an amount of the structural unit with respect to total structural units in the polymer is 14 mol % or more and 25 mol % or less.

10. The radiation-sensitive resin composition according to claim 1, wherein an amount of the polymer with respect to total solid content of the radiation-sensitive resin composition is 70% or more.

11. The radiation-sensitive resin composition according to claim 1, wherein an amount of the polymer with respect to total solid content of the radiation-sensitive resin composition is 80% or more.

12. The radiation-sensitive resin composition according to claim 1, wherein an amount of the polymer with respect to total solid content of the radiation-sensitive resin composition is 85% or more.

13. The radiation-sensitive resin composition according to claim 1, further comprising an acid diffusion controller.

14. The radiation-sensitive resin composition according to claim 1, further comprising a fluorine atom-containing polymer.

15. A resist pattern-forming method comprising:
applying the radiation-sensitive resin composition according to claim 1 directly or indirectly on a substrate to form a resist film;
exposing the resist film; and
developing the exposed resist film.

16. The resist pattern-forming method according to claim 15, wherein a radioactive ray used in the exposing is a KrF excimer laser beam, an electron beam, or an extreme ultraviolet ray.

* * * * *

UNITED STATES PATENT AND TRADEMARK OFFICE
CERTIFICATE OF CORRECTION

PATENT NO.        : 9,874,816 B2
APPLICATION NO.   : 15/079753
DATED             : January 23, 2018
INVENTOR(S)       : Hayato Namai Page 1 of 1

It is certified that error appears in the above-identified patent and that said Letters Patent is hereby corrected as shown below:

In the Claims

Column 80, Lines 41-49, Claim 1, "$R^4$" in the formula (1) should read -- $(R^4)_m$ --.

Column 82, Line 50, Claim 5, "a plurality of $R^1$'s" should read -- a plurality of $R^{13}$'s --.

Signed and Sealed this
Sixteenth Day of April, 2019

Andrei Iancu
*Director of the United States Patent and Trademark Office*